United States Patent
Zhan et al.

(10) Patent No.: US 11,909,368 B2
(45) Date of Patent: Feb. 20, 2024

(54) DUAL MODE NOTCH FILTER

(71) Applicant: QUALCOMM INCORPORATED, San Diego, CA (US)

(72) Inventors: Kai Zhan, San Diego, CA (US); Chinmaya Mishra, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 213 days.

(21) Appl. No.: 17/467,494

(22) Filed: Sep. 7, 2021

(65) Prior Publication Data

US 2022/0200576 A1 Jun. 23, 2022

Related U.S. Application Data

(60) Provisional application No. 63/127,912, filed on Dec. 18, 2020.

(51) Int. Cl.
*H03H 11/04* (2006.01)
*H03F 3/24* (2006.01)
*H04B 1/04* (2006.01)

(52) U.S. Cl.
CPC ............. *H03H 11/04* (2013.01); *H03F 3/245* (2013.01); *H04B 1/04* (2013.01); *H03F 2200/451* (2013.01); *H03H 2011/0488* (2013.01)

(58) Field of Classification Search
None
See application file for complete search history.

(56) References Cited

U.S. PATENT DOCUMENTS

| | | | |
|---|---|---|---|
| 7,702,294 B2 * | 4/2010 | Granata | H03H 11/52 |
| | | | 333/202 |
| 7,809,349 B1 | 10/2010 | Granger-Jones et al. | |
| 8,130,054 B1 | 3/2012 | Martin et al. | |
| 8,208,887 B2 * | 6/2012 | Lee | H04B 1/18 |
| | | | 455/340 |
| 8,428,203 B1 | 4/2013 | Zortea et al. | |
| 9,559,659 B2 | 1/2017 | Bojer | |
| 9,595,936 B2 | 3/2017 | Ding et al. | |
| 9,960,795 B1 * | 5/2018 | Liu | H04B 1/0475 |
| 10,164,722 B1 * | 12/2018 | Napoles | H04B 1/406 |
| 2010/0214066 A1 | 8/2010 | Lai | |

(Continued)

FOREIGN PATENT DOCUMENTS

WO 2020025070 A1 2/2020

OTHER PUBLICATIONS

Partial International Search Report—PCT/US2021/060288—ISA/EPO—dated Mar. 24, 2022.

(Continued)

*Primary Examiner* — Kenneth B Wells
(74) *Attorney, Agent, or Firm* — Smith Tempel Blaha LLC/Qualcomm Incorporated

(57) ABSTRACT

A dual mode notch filter for use in a multi-band millimeter wave (mmW) transmitter includes a transmit filter circuit disposed between two amplifiers in a mmW transmit signal path, the transmit filter circuit formed by at least one switch, at least one capacitor, and a double-tuned transformer, the transmit filter circuit having at least two modes configured to selectively filter a spurious signal in at least a first communication band.

30 Claims, 20 Drawing Sheets

(56) References Cited

U.S. PATENT DOCUMENTS

| | | | |
|---|---|---|---|
| 2013/0259102 A1* | 10/2013 | Gudem | H04B 1/525 455/79 |
| 2015/0349722 A1 | 12/2015 | Wang et al. | |
| 2015/0358041 A1 | 12/2015 | Li et al. | |
| 2016/0112146 A1 | 4/2016 | Lau et al. | |
| 2017/0063411 A1* | 3/2017 | Ripley | H04B 1/18 |
| 2019/0109575 A1* | 4/2019 | Darvishi | H03H 7/01 |
| 2019/0273314 A1 | 9/2019 | Wloczysiak | |

OTHER PUBLICATIONS

International Search Report and Written Opinion—PCT/US2021/060288—ISA/EPO—dated Jul. 29, 2022.

* cited by examiner

DUAL MODE NOTCH FILTER

RELATED APPLICATIONS

This application claims priority to and the benefit of U.S. Provisional Patent Application No. 63/127,912, entitled "DUAL MODE NOTCH FILTER," filed Dec. 18, 2020, the contents of which are hereby incorporated herein by reference in their entirety as if fully set forth below and for all applicable purposes.

FIELD

The present disclosure relates generally to electronics, and more specifically to radio frequency (RF) transmitters and receivers.

BACKGROUND

Wireless communication devices and technologies are becoming ever more prevalent, as are communication devices that operate at millimeter-wave (mmW) frequencies. Wireless communication devices generally transmit and/or receive communication signals.

A transmitter in a mmW communication system generally uses one or more amplifier stages having one or more mixers to upconvert a signal for transmission. For example, in the upconversion path, a baseband (or near baseband) signal, or an intermediate frequency (IF) signal may be upconverted by a mixer to a radio frequency (RF) signal for transmission. This upconversion may result in spurious tones at the mixer output. These spurious signals or tones (sometimes called spurs) may occur at the local oscillator (LO) frequency, and at harmonic frequencies of the LO signal, such as two times the LO (2LO) frequency, and may have signal energy that may appear sufficiently close to a communication signal in a communication signal band to detrimentally affect the communication signal. Other spurious signals may also occur unrelated to the upconversion process.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a transmit filter circuit including a positive input terminal, a negative input terminal, a center-tapped inductance having a first terminal coupled to the positive input terminal and a second terminal coupled to the negative input terminal, a switch having a first terminal coupled to the first terminal of the center-tapped inductance and a second terminal coupled to the second terminal of the center-tapped inductance, a first capacitance coupled between the first terminal of the switch and the first terminal of the center-tapped inductance, and a second capacitance coupled between the second terminal of the switch and the second terminal of the center-tapped inductance.

Another aspect of the disclosure provides, in a multi-band millimeter wave (mmW) transmitter that incorporates a transmit architecture that includes an upconversion mixer, a transmit filter circuit located after the upconversion mixer at one or more locations along a mmW signal path, the transmit filter circuit configured to reduce unwanted spectral emission of a local oscillator (LO) signal on at least one of a first communication band and a second communication band, the transmit filter circuit formed by at least one switch, a center-tapped inductance and a capacitance, the transmit filter circuit configured to provide in a first operating mode a first filter response configured to reduce unwanted spectral emission of the LO signal to a first communication signal in the first communication band, while having a negligible effect on a second communication signal in the second communication band, and the transmit filter circuit configured to provide in a second operating mode a second filter response.

Another aspect of the disclosure provides a method for filtering a communication signal including providing a first filter response, and providing a second filter response, the first filter response configured to reduce unwanted spectral emission of a local oscillator (LO) signal to a first communication signal in a first communication band, while having a negligible effect on a second communication signal in a second communication band.

Another aspect of the disclosure provides a device including means for providing a first filter response, and means for proving a second filter response, the first filter response configured to reduce unwanted spectral emission of a local oscillator (LO) signal to a first communication signal in a first communication band, while having a negligible effect on a second communication signal in a second communication band.

Another aspect of the disclosure provides a dual mode notch filter for use in a multi-band millimeter wave (mmW) transmitter including a transmit filter circuit located at one or more locations along a mmW signal path, the transmit filter circuit formed by at least one switch, a center-tapped inductance and a capacitance, the transmit filter circuit configured to reduce unwanted spectral emission of a spurious signal on at least one of a first communication band and a second communication band.

Another aspect of the disclosure provides a dual mode notch filter for use in a multi-band millimeter wave (mmW) transmitter including a transmit filter circuit disposed between two amplifiers in a mmW transmit signal path. The transmit filter circuit may be formed by at least one switch, at least one capacitor, and a double-tuned transformer. Further, the transmit filter circuit may have at least two modes configured to selectively filter a spurious signal in at least a first communication band.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

Figure 1:
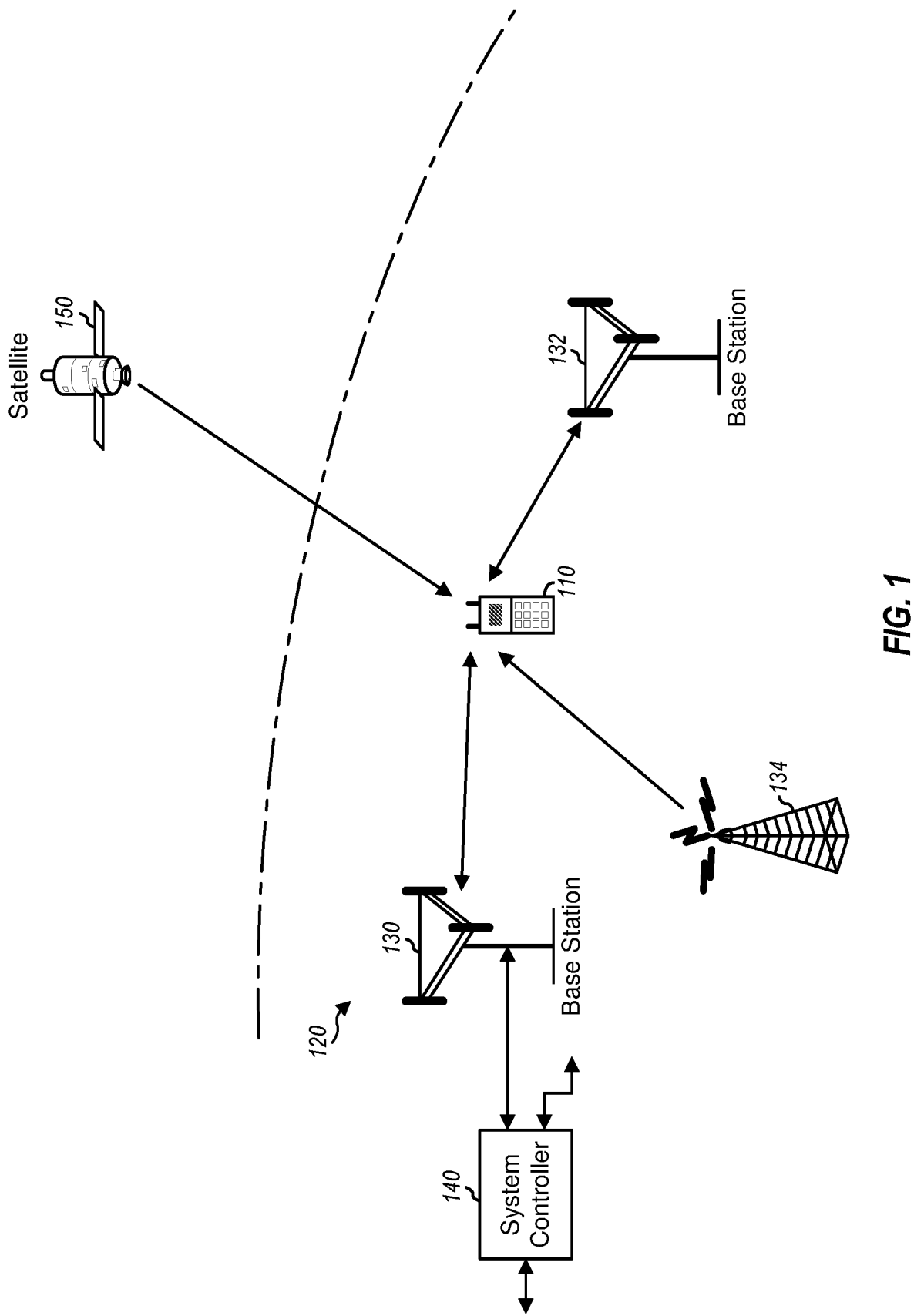
FIG. 1 is a diagram showing a wireless device communicating with a wireless communication system.

The word "exemplary" is used herein to mean "serving as an example, instance, or illustration." Any aspect described herein as "exemplary" is not necessarily to be construed as preferred or advantageous over other aspects.

A modern wireless communication device that operates at millimeter-wave (mmW) frequencies on multiple communication bands generally should meet a number of radio frequency (RF) energy emission standards. Emissions allowed at the local oscillator (LO) and 2LO frequencies in a mmW 5G communication system are stringent, typically on the order of −36 dBc for user equipment (UE) and on the order of −46 dBc for customer premises equipment (CPE).

Some mmW communication systems and devices use a type of transmit and receive architecture referred to as heterodyne, or super-heterodyne. A super-heterodyne architecture uses an intermediate frequency, that is, a transmit signal is upconverted first from a baseband (or near baseband) signal to an intermediate frequency (IF), and is then upconverted from the IF to a radio frequency (RF) signal using a local oscillator (LO) frequency signal for IF signal upconversion and transmission. Similarly, a receive signal is downconverted first from an RF frequency to an IF frequency, and then downconverted from the IF to a baseband (or near baseband) signal for information recovery.

When an IF signal is mixed with an LO signal, wanted and unwanted mixing products may result. An unwanted signal may be referred to as a spurious signal or a spurious tone, and may also generate what can be referred to as one or more unwanted spectral emission effects. The IF and LO mixer frequencies are generally chosen such that the unwanted spectral emissions, such as the spurious tones, fall outside the frequency range of the mmW signal path, that is they fall out-of-band of desired communication signals. However, it is possible that a spurious tone may fall sufficiently close to a communication band so as to degrade a desired signal in the communication band. Example bands for a mmW communication system may include the 37 GHz-43.5 GHz band (which may encompass a 37 GHz to 40 GHz band and a 40 GHz to 43.5 GHz band) and the 48 GHz band, which may span 47.2 GHz to 48.2 GHz. For example, in order to minimize LO frequency tuning range and also to prevent a very high IF frequency, the 48 GHz communication band may use an LO frequency of 34 GHz which is located outside of the 37 GHz-43.5 GHz band. Similarly, the LO frequency for the 37 GHz-43.5 GHz band may be 26 GHz, resulting in a 2LO of 52 GHz that falls close to the 48 GHz band. Devices configured to pursuant embodiments described herein may be operable to communication in one or more of these frequency bands, or in bands lower and/or higher than these bands. For example, such devices may be operable to communicate in or more bands that include mmW frequencies, where mmW frequencies may be considered frequencies of approximately 20 GHz or higher, for example around 24 GHz or higher.

One way to minimize the detrimental effect of spurious emissions from the LO on a communication signal is to design narrow band amplifier stages. However, narrow band amplifier stages dictate the use of separate paths for each sub-band, potentially resulting in a larger chip area.

Exemplary embodiments of a dual mode notch filter disclosed herein can be used to reject spurious signal energy, such as spurious LO and/or 2LO signal energy, when operating at one particular band (for example, the 48 GHz band) and can be disabled, thereby having little effect on another band, or can be used to reject spurious 2LO signal energy when operating in another band (for example, the band that spans 37 GHz-43.5 GHz), while having little effect on another band (for example the 48 GHz band).

Exemplary embodiments of a dual mode notch filter disclosed herein can be used to reject spurious signal energy at frequencies on either a lower frequency side or an upper frequency side of a communication signal band, regardless of LO or 2LO frequency.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, 5G, etc.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams. Wireless device 110 may be able to operate in a variety of communication bands including, for example, those communication bands used by LTE, WiFi, 5G or other communication bands, over a wide range of frequencies.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
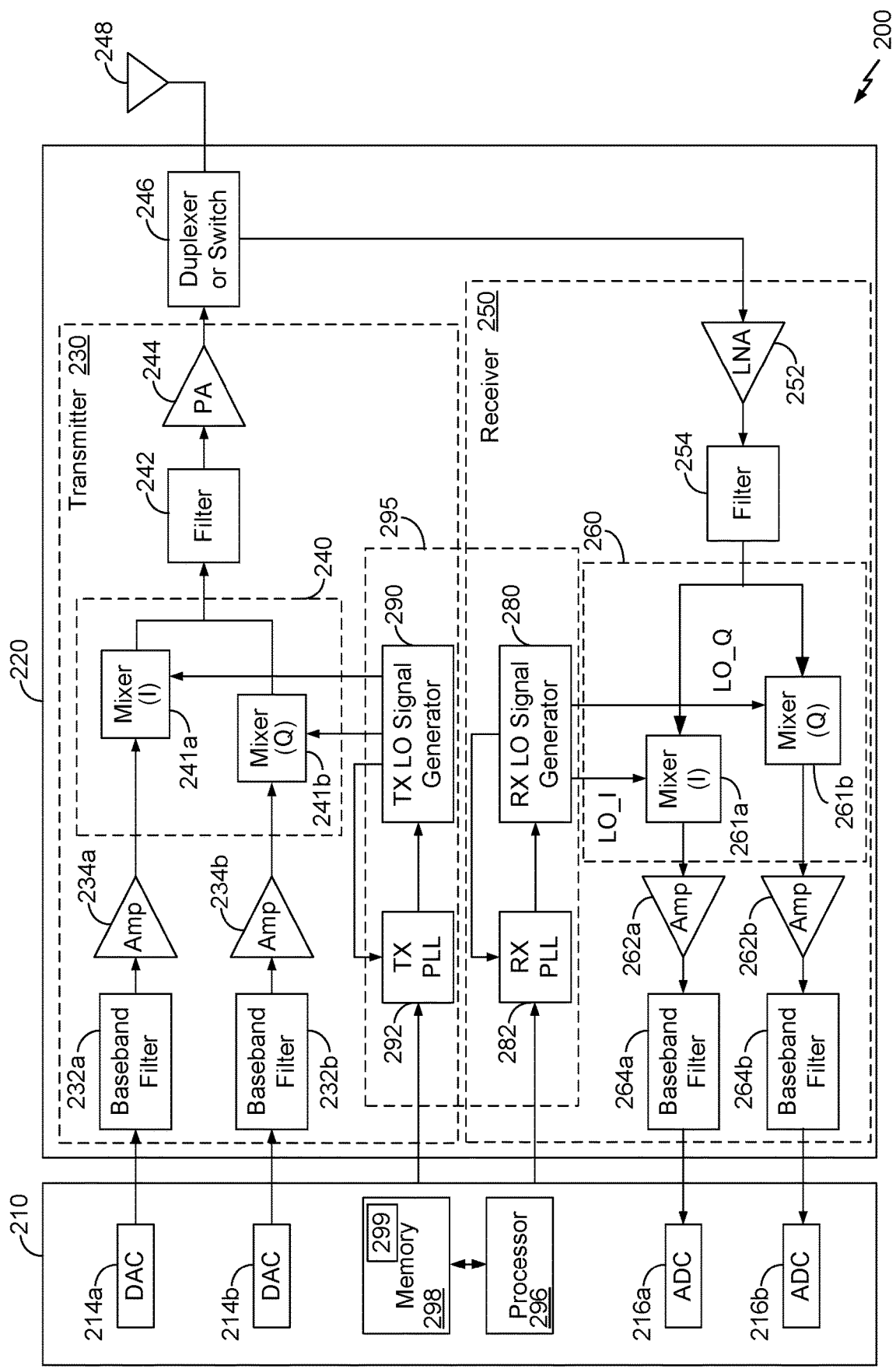
FIG. 2 is a block diagram showing a wireless device in which the exemplary techniques of the present disclosure may be implemented.

FIG. 2 is a block diagram showing a wireless device 200 in which the exemplary techniques of the present disclosure may be implemented. The wireless device 200 may, for example, be an embodiment of the wireless device 110 illustrated in FIG. 1. In other embodiments, the wireless device 200 may be an example of one of the base stations, 130, 132, or a device not illustrated in FIG. 1 such as a customer premises equipment (CPE), etc.

FIG. 2 shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other figure in the drawings, may be either single-ended or differential. Some circuit blocks in FIG. 2 may also be omitted.

In the example shown in FIG. 2, wireless device 200 generally comprises the transceiver 220 and a data processor 210. The data processor 210 may include a processor 296 operatively coupled to a memory 298. The memory 298 may be configured to store data and program codes, as exemplary software or firmware 299, and may generally comprise analog and/or digital processing elements. The processor 296 and the memory 298 may cooperate to control, configure, program, or otherwise fully or partially control the operation of the embodiments of the dual mode notch filter described herein.

The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2, transmitter 230 and receiver 250 are implemented with the direct-conversion architecture. In other examples, such as the example discussed with respect to FIGS. 3A and 3B, a super-heterodyne architecture may be used.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DACs) 214a and 214b for converting digital signals generated by the data processor 210 into the I and Q analog output signals, e.g., I and Q output currents, for further processing. In other embodiments, the DACs 214a and 214b are included in the transceiver 220 and the data processor 210 provides data (e.g., for I and Q) to the transceiver 220 digitally.

Within the transmitter 230, baseband filters 232a and 232b (which may comprise lowpass filters) filter the I and Q analog transmit signals, respectively, to remove undesired images caused by the prior digital-to-analog conversion Amplifiers (Amp) 234a and 234b amplify the signals from baseband filters 232a and 232b, respectively, and provide I and Q baseband signals. An upconverter 240 upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal may be routed through a duplexer or switch 246 and transmitted via an antenna 248. While examples discussed herein utilize I and Q signals, those of skill in the art will understand that elements of the transceiver may be configured to utilize polar modulation.

In the receive path, antenna 248 receives communication signals and provides a received RF signal, which may be routed through duplexer or switch 246 and provided to a low noise amplifier (LNA) 252. The duplexer 246 may be designed to operate with a specific RX-to-TX duplexer frequency separation, such that RX signals are isolated from TX signals. The received RF signal is amplified by LNA 252 and filtered by a filter 254 to obtain a desired RF input signal. Downconversion mixers 261a and 261b in a downconverter 260 mix the output of filter 254 with I and Q receive (RX) LO signals (i.e., LO_I and LO_Q) from an RX LO signal generator 280 to generate I and Q baseband signals. The I and Q baseband signals are amplified by amplifiers 262a and 262b and further filtered by baseband filters 264a and 264b (which may comprise lowpass filters) to obtain I and Q analog input signals, which are provided to data processor 210. In the exemplary embodiment shown, the data processor 210 includes analog-to-digital-converters (ADCs) 216a and 216b for converting the analog input signals into digital signals to be further processed by the data processor 210. In some embodiments, the ADCs 216a and 216b are included in the transceiver 220 and provide data to the data processor 210 digitally.

In FIG. 2, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

In an exemplary embodiment, the RX PLL 282, the TX PLL 292, the RX LO signal generator 280, and the TX LO signal generator 290 may be combined into a single LO generator circuit 295, which may provide the TX LO signals and the RX LO signals. Alternatively, separate LO generator circuits may be used to generate the TX LO signals and the RX LO signals.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain elements of the transceiver 220 are functionally illustrated in FIG. 2, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules. For example, the power amplifier 244, the filter 242, the LNA 252, and/or the duplexer 246 may be implemented in separate modules or as discrete components, while the remaining elements illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide good linearity, good efficiency, or a combination of good linearity and efficiency. Other output stages may be implemented in the power amplifier 244 instead of or in addition to the stages recited above. Exemplary embodiments of the dual mode notch filter described herein may be implemented in one or more locations within the filter 242, within the power amplifier 244, within the LNA 252, within the filter 254, or elsewhere. In some embodiments, the dual mode notch filter described herein may be implemented on the same IC and/or within the same module as the filter 242, the power amplifier 244, the LNA 252, and/or the filter 254. In some embodiments the power amplifier 244, the filter 242, the LNA 252, and the filter 254 may be implemented together in a single physical module. In other embodiments, one or more of these elements may be implemented separate from a module or IC in which another of the elements is implemented.

Figure 3A:
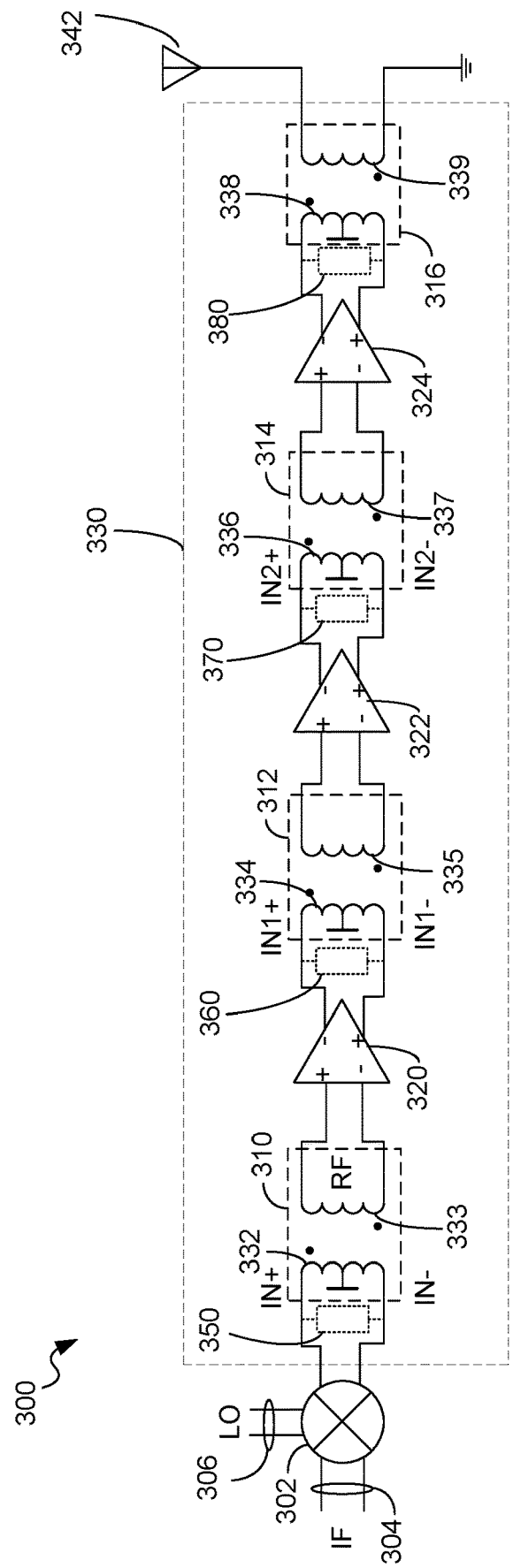
FIG. 3A is a block diagram of at least a portion of an exemplary transmit chain in which exemplary embodiments of the dual mode notch filter may be implemented.

FIG. 3A is a block diagram of at least a portion of an exemplary transmit chain 300 in which exemplary embodiments of the dual mode notch filter may be implemented. In an exemplary embodiment, the transmit chain 300 may be implemented in a mmW communication device that implements a super-heterodyne (superhet) architecture in which a communication signal that is to be transmitted may be converted from a baseband (or near baseband) information signal, to an intermediate frequency signal, and then upconverted from the intermediate frequency to a radio frequency signal. Similarly, a received communication signal may be downconverted from an RF signal, to an IF signal, and then further downconverted from the IF signal to a baseband (or near baseband) information signal. For example, in some embodiments, an additional mixer (e.g., mixer 302 described below) is implemented between the filter 242 and the PA 244. In some embodiments, another additional mixer is also included between the LNA 252 and the filter 254. In some such embodiments, these additional mixers, the PA 244, and the LNA 252 are implemented in an RFIC separate from an IC on which other elements of the transceiver 220 are implemented. The separate RFIC may be integrated into a module including the antenna 248 in some embodiments. In some embodiments including the additional mixers, an LO for communications having mmW frequencies is implemented, and may be included in the RFIC. While the description below includes a superhet architecture, those of skill in the art will understand that embodiments are not limited to amplifiers in such architecture. Further, those of skill in the art will understand that the embodiments described herein may be implemented in a receive chain. The exemplary transmit chain 300 is shown for illustrative purposes only may comprise a portion of a transmit chain in an mmW communication device, such as wireless device 200 (FIG. 2).

In an exemplary embodiment, the transmit chain 300 may comprise a mixer 302 configured to receive an intermediate frequency (IF) communication signal over differential connections 304, and a local oscillator (LO) signal over differential connections 306. The mixer 302 may be referred to as an upconversion mixer, and may be configured to operate over a range of different frequencies. The mixer 302, using the LO signal, may be configured to upconvert the IF communication signal to a mmW frequency communication signal (referred to in FIG. 3 as an RF signal).

In an exemplary embodiment, the transmit chain 300 may comprise one or more amplifier stages, with three exemplary amplifier stages 320, 322 and 324 shown in FIG. 3 for example only. The three amplifier stages 320, 322 and 324 may be configured to provide the same or different levels of signal amplification. In an exemplary embodiment, the first amplifier stage 320 and the second amplifier stage 322 may be referred to as driver stages, and the third amplifier stage 324 may be referred to as a power amplifier. More or fewer amplifier stages may be included in a transmit chain, depending on application.

In an exemplary embodiment, the transmit chain 300 may comprise one or more transformers 310, 312, 314 and 316. The transformers 310, 312, 314 and 316 may be configured to pass a communication signal, such as an RF signal, from amplifier stage to amplifier stage. The transformers 310, 312, 314 and 316 may each comprise a primary side and a secondary side. For example, the transformer 310 may comprise a primary side 332 and a secondary side 333. Similarly, the transformer 312 may comprise a primary side 334 and a secondary side 335; the transformer 314 may comprise a primary side 336 and a secondary side 337; and the transformer 316 may comprise a primary side 338 and a secondary side 339. An output of the third amplifier stage 324 may be provided through the transformer 316 to an antenna 342 for transmission.

The transformers 310, 312, 314 and 316 may be implemented as double-tuned transformers in which the inductances of the primary side and the secondary side may be tuned/resonated separately with a capacitor (not shown) across each inductance. A double-tuned transformer may typically be used for wideband operation. Exemplary embodiments of the dual mode notch filter described herein may be implemented in parallel with the primary side of a double-tuned transformer. However, exemplary embodiments of the dual mode notch filter described herein will operate with other type of transformers in addition to a double-tuned transformer.

In an exemplary embodiment, an instance of a dual mode notch filter 350 may be implemented in, as part of, or in proximity to the transformer 310. In an exemplary embodiment, an instance of a dual mode notch filter 360 may be implemented in, as part of, or in proximity to the transformer 312; an instance of a dual mode notch filter 370 may be implemented in, or as part of, or in proximity to the transformer 314; and an instance of a dual mode notch filter 380 may be implemented in, or as part of, or in proximity to the transformer 316. The instances of the dual mode notch filter 350, 360, 370 and 380 may comprise the same or different configurations, and may be configured to provide the same or different filter response. Exemplary embodiments of the instances of the dual mode notch filter 350, 360, 370 and 380 are illustrated in FIG. 3 as being located in proximity to and in parallel with respective primary sides 332, 334, 336 and 338 of respective transformers 310, 312, 314 and 316 for convenience only, and may be located elsewhere. Embodiments of the transmit chain 300, including embodiments of the dual mode notch filter described herein may also be implemented in the filter 242 and/or the power amplifier 244 of FIG. 2.

In an exemplary embodiment, the transformers 310, 312, 314 and 316; the amplifier stages 320, 322, and 324; and the dual mode notch filters 350, 360, 370, and 380 may comprise a transmit path 330, where one or more transmit paths 330 may be implemented in a phased array architecture. The transmit path 330 may include a fewer or greater number of amplifier stages, transformers, and/or filters in other embodiments.

Figure 3B:
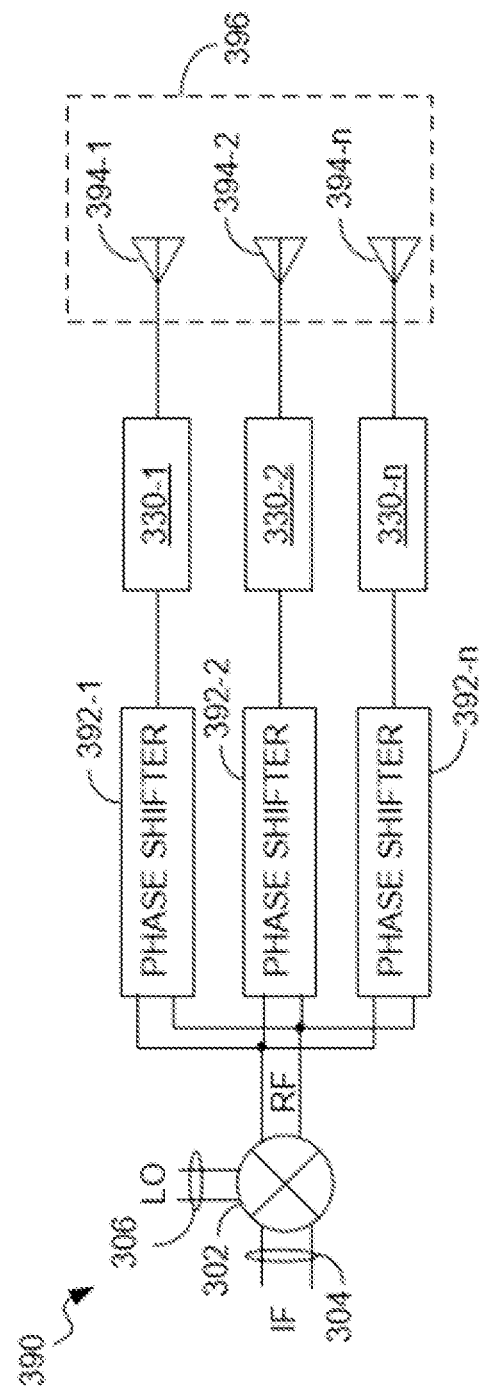
FIG. 3B is a block diagram of at least a portion of an exemplary transmit chain in which exemplary embodiments of the dual mode notch filter may be implemented.

FIG. 3B is a block diagram of at least a portion of an exemplary transmit chain 390 in which exemplary embodiments of the dual mode notch filter may be implemented. The transmit chain 390 is an example of a phased array antenna architecture in which multiple transmit paths 330-1, 330-2 through 330-$n$ may be coupled to the mixer 302. In an exemplary embodiment, the number of transmit paths 330 is dependent upon implementation, with three transmit paths 330-1, 330-2 and 330-$n$ shown in FIG. 3B for simplicity of illustration.

In an exemplary embodiment, an input of each transmit path 330 is coupled to a respective phase shifter 392, where transmit path 330-1 is coupled to a phase shifter 392-1, transmit path 330-2 is coupled to a phase shifter 392-1 and transmit path 330-$n$ is coupled to a phase shifter 392-$n$. In an exemplary embodiment, each phase shifter 392 is coupled between the mixer 302 and the respective transmit path 330. In such embodiments, an output of each of the transmit paths 330 is coupled to a respective antenna element 394 in an array 396 of antenna elements. For example, transmit path 330-1 is coupled to antenna element 394-1, transmit path 330-2 is coupled to antenna element 394-2 and transmit path 330-$n$ is coupled to antenna element 394-$n$.

Figure 4:
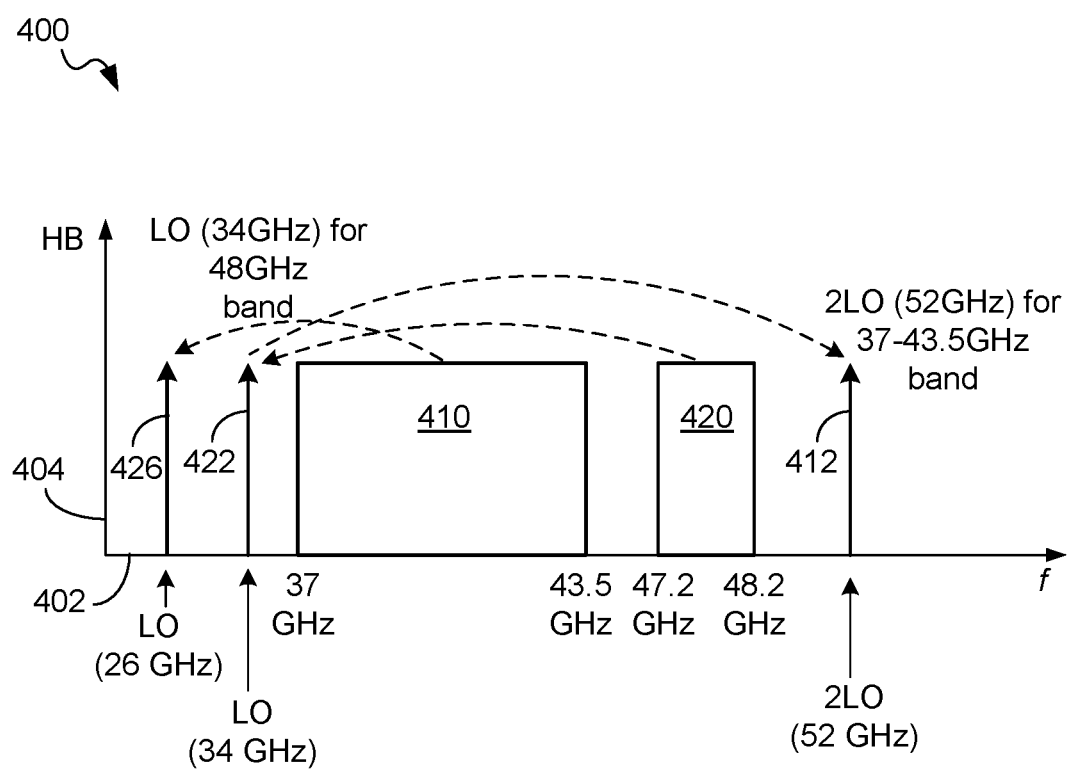
FIG. 4 shows a graph of a portion of a communication spectrum.

FIG. 4 shows a graph 400 of a portion of a communication spectrum. The graph 400 includes a horizontal axis 402 that shows frequency increasing to the right, and a vertical axis 404 showing signal energy increasing upwardly. In an exemplary embodiment, the vertical axis 404 is labeled "HB" corresponding to "high band" energy; however, the exemplary embodiments of the dual mode notch filter described herein may be implemented in other communication bands.

The graph 400 also shows a communication band 410 spanning approximately 37 GHz to approximately 43.5 GHz; and shows a communication band 420 spanning approximately 47.2 GHz to approximately 48.2 GHz. The communication band 410 will also be interchangeably referred to as the 37-43.5 GHz band and the communication band 420 will also by interchangeably referred to as the 48 GHz band.

In an exemplary embodiment, various frequency plans for a variety of communication bands may be implemented. An example of a local oscillator frequency for signals in the 48 GHz communication band 420 may be located at approximately 34 GHz, and is shown using reference numeral 422. An example of a local oscillator frequency for signals in the 37-43.5 GHz communication band 410 may be located at approximately 26 GHz, and is shown using reference numeral 426. However, a second harmonic of the 26 GHz may appear at 52 GHz, shown using reference numeral 412. In an exemplary embodiment, the 34 GHz LO signal 422, or spurious tones generated by mixing the 34 GHz LO signal with a communication signal in the 48 GHz band 420 may contribute to interference with a communication signal in the 37-43.5 GHz communication band 410. Similarly, and for example only, the 52 GHz 2LO signal 412, or spurious tones generated by mixing the 26 GHz LO signal with a communication signal in the 37-43.5 GHz band 410 may contribute to interference with a communication signal in the 48 GHz communication band. As will be described herein, the exemplary embodiments of the dual mode notch filter may be used to create a notch filter response to minimize any detrimental impact of the 34 GHz LO signal 422, and spurious tones thereof, on desired signals in the 37-43.5 GHz communication band 410, while not degrading the communication signal in the 48 GHz communication band 420; and may be used to create a notch filter response to minimize any detrimental impact of the 52 GHz 2LO signal 412, and spurious tones thereof, on desired signals in the 48 GHz communication band 420, while not degrading a communication signal in the 37-43.5 GHz communication band 410.

Figure 5:
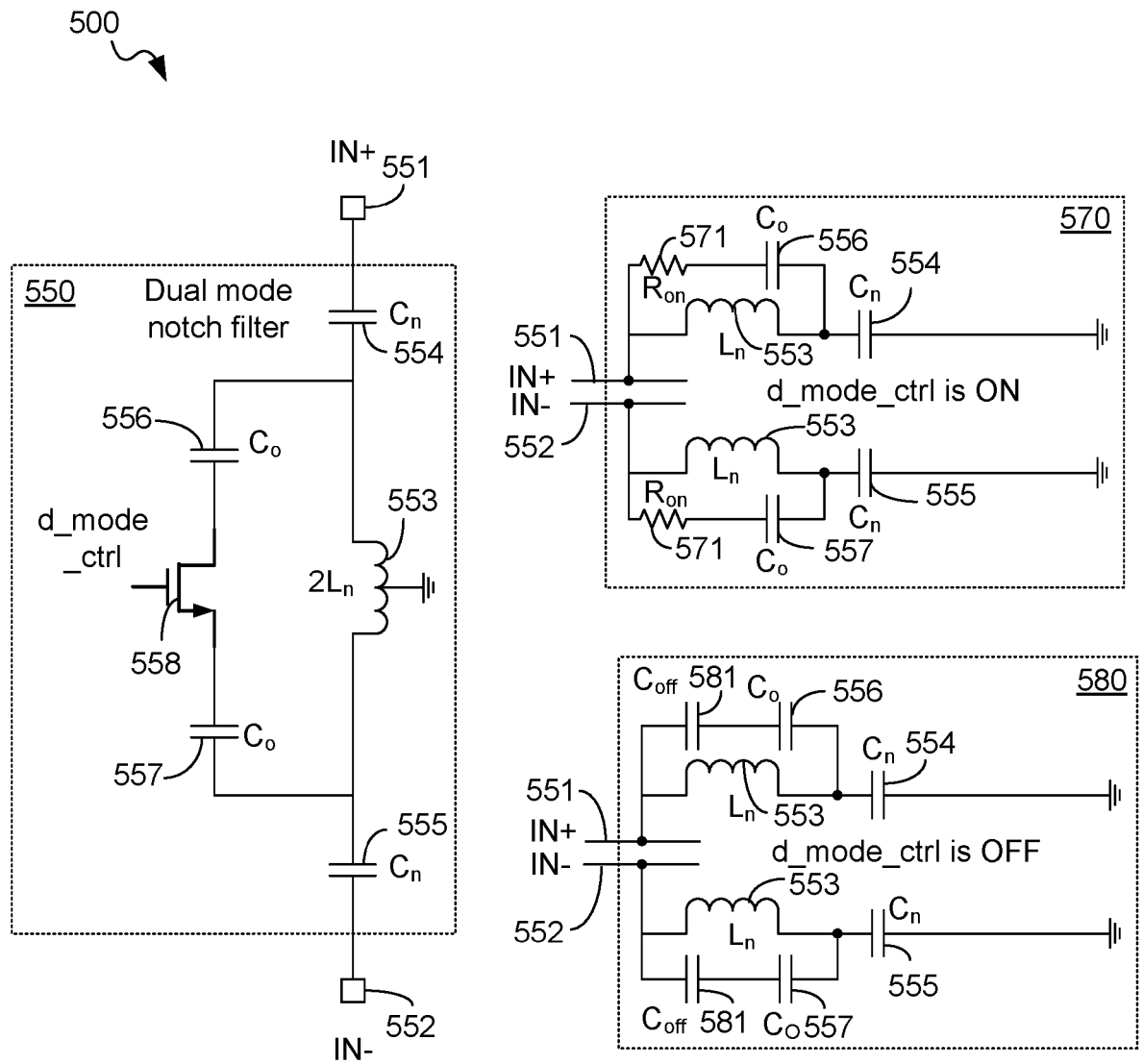
FIG. 5 is a schematic diagram showing a dual mode notch filter in accordance with an exemplary embodiment of the disclosure.

FIG. 5 is a schematic diagram 500 showing a dual mode notch filter in accordance with an exemplary embodiment of the disclosure. In an exemplary embodiment, a dual mode notch filter 550 may be implemented in a differential communication system and may comprise a capacitance 554 coupled to a positive input terminal (IN+) 551 and a capacitance 555 coupled to a negative input terminal (IN−) 552. The capacitances 554 and 555 may be referred to as Cn. The value of Cn may be chosen based on operating frequency, desired filter response and a number of other parameters.

An inductance 553 is coupled between the capacitances 554 and 555. The inductance 553 may be referred to as 2Ln, where the value of Ln may be chosen based on operating frequency, desired filter response and a number of other parameters. In the dual mode notch filter 550, the inductance 553 is shown as 2Ln for convenience such that in the equivalent circuits 570 and 580, the inductance 553 can be shown as Ln. In an exemplary embodiment, a center tap of the inductance 553 may be coupled to system ground, and the inductance 553 may be referred to as a center-tapped inductance.

In an exemplary embodiment, a switch 558 may be coupled between capacitances 556 and 557, in parallel across the inductance 553. In an exemplary embodiment, the switch 558 may be implemented in a variety of ways, including as a metal oxide semiconductor (MOS) transistor device. In an exemplary embodiment, the switch 558 may be implemented as an n-type MOS (NMOS) transistor device or a p-type MOS (PMOS) transistor device, and is shown as an NMOS transistor device in this example. Other technologies may also be used to implement the switch 558.

The capacitances 556 and 557 may be referred to as Co. The value of Co may be chosen based on operating frequency, desired filter response and a number of other parameters.

In an exemplary embodiment, the dual mode notch filter 550, and other embodiments of a dual mode notch filter described herein, may be referred to as a "switched shunt trap" because in an exemplary embodiment the dual mode notch filter 550 may be implemented in parallel (in shunt) with the primary winding of a transformer (such as in parallel with the primary sides 332, 334, 336 and/or 338 of respective transformers 310, 312, 314 and/or 316 of FIG. 3).

In an exemplary embodiment, the switch 558 may be configured to receive a control signal, d_mode_ctrl, at its gate. The control signal, d_mode_ctrl may be provided by the data processor 210 of FIG. 2, or by another control element. Depending on the state of the control signal, d_mode_ctrl, the switch 558 will be either conductive (ON) or non-conductive (OFF). In an exemplary embodiment, the switch 558 may be configured to selectively couple at least one of the capacitances 556 or 557 across a winding of the inductance 553 of a double-tuned transformer, such as any of the transformers 310, 312, 314 and 316 of FIG. 3A. In an exemplary embodiment, another of the capacitances 556 or 557 may be selectively coupled across the winding of the inductance 553 of a double-tuned transformer, such as any of the transformers 310, 312, 314 and 316 of FIG. 3A.

In the exemplary embodiment shown in FIG. 5, the drain of the switch 558 is coupled to the capacitance 556 and the source of the switch 558 is coupled to the capacitance 557.

Also shown in FIG. 5 are equivalent circuits corresponding to the state of the switch 558. A first equivalent circuit 570 shows the electrical arrangement of the dual mode notch filter 550 when the switch 558 is conductive (ON), that is, when the control signal, d_mode_ctrl is asserted and the switch 558 is conductive (ON); and a second equivalent circuit 580 shows the electrical arrangement of the dual mode notch filter 550 when the switch 558 is non-conductive (OFF), that is, when the control signal, d_mode_ctrl is de-asserted and the switch 558 is non-conductive (OFF). In an exemplary embodiment, when the switch 558 is conductive (ON), the dual mode notch filter 550 is OFF; and when the switch 558 is non-conductive (OFF), the dual mode notch filter 550 is ON, also referred to as being in LO notch mode.

In the first equivalent circuit 570, when the control signal, d_mode_ctrl is asserted and the switch 558 is conductive (ON), the switch 558 appears as a resistance 571 with a value Ron. The on-resistance, Ron, of the switch 558 is dependent on the size of the device from which the switch 558 is fabricated, and the voltage applied to its gate, source and drain terminals. The value of Ron may be chosen based on circuit design considerations, operating frequency, and other factors.

In the second equivalent circuit 580, when the control signal, d_mode_ctrl is de-asserted and the switch 558 is non-conductive (OFF), the switch 558 appears as a capacitance 581 with a value Coff. The off-capacitance, Coff, of the switch 558 is dependent on the size of the device from which the switch 558 is fabricated, and the voltage applied to its gate, source and drain terminals. The value of Coff may be chosen based on circuit design considerations, operating frequency, and other factors.

In this exemplary embodiment, in a first mode, when the switch 558 is OFF and the dual mode notch filter 550 is in LO notch mode, the capacitance 581 (Coff) and the capacitances 556 and 557 (Co), and the capacitances 554 and 555 (Cn), together with the inductance, Ln, of the inductance 553, determine the response of the dual mode notch filter 550.

In this exemplary embodiment, in a second mode, when the switch 558 is ON and the dual mode notch filter 550 is OFF, the capacitances 556 and 557 (Co), and the capacitances 554 and 555 (Cn), together with the inductance, Ln, of the inductance 553, determine the response of the dual mode notch filter 550.

When the switch 558 is ON:

$$Z_{in} \text{ is open/high at } \omega \sim \omega_o$$

$$L_n C_o = \frac{1}{\omega_o^2}$$

$$Z_{in} = \frac{1}{sC_n} + \frac{sL_n}{1 - \frac{\omega^2}{\omega_o^2}}$$

When the switch 558 is OFF:

$$\omega_{off} > \omega_o, Z_{in} \text{ is short at } \omega_{LO}, Z_{in} \text{ is open/high at } \omega \sim \omega_{off}$$

$$L_n \frac{2 C_o C_{off}}{C_o + 2 C_{off}} = \frac{1}{\omega_{off}^2}$$

$$\frac{L_n}{1 - \frac{\omega_{LO}^2}{\omega_{off}^2}} C_n = \frac{1}{\omega_{LO}^2}$$

$$Z_{in} = \frac{1}{sC_n} + \frac{sL_n}{1 - \frac{\omega^2}{\omega_{off}^2}}$$

In an exemplary embodiment, the dual mode notch filter 550 may be implemented in a wideband mmW transmitter that operates with a signal frequency that may range from $\omega_o$ to $\omega_{off}$. In an exemplary embodiment, the frequency $\omega_{LO}$ is the LO frequency, for example, 34 GHz, the frequency $\omega_o$ is 37 GHz, and the frequency $\omega_{off}$ is 48.2 GHz.

Figure 6:
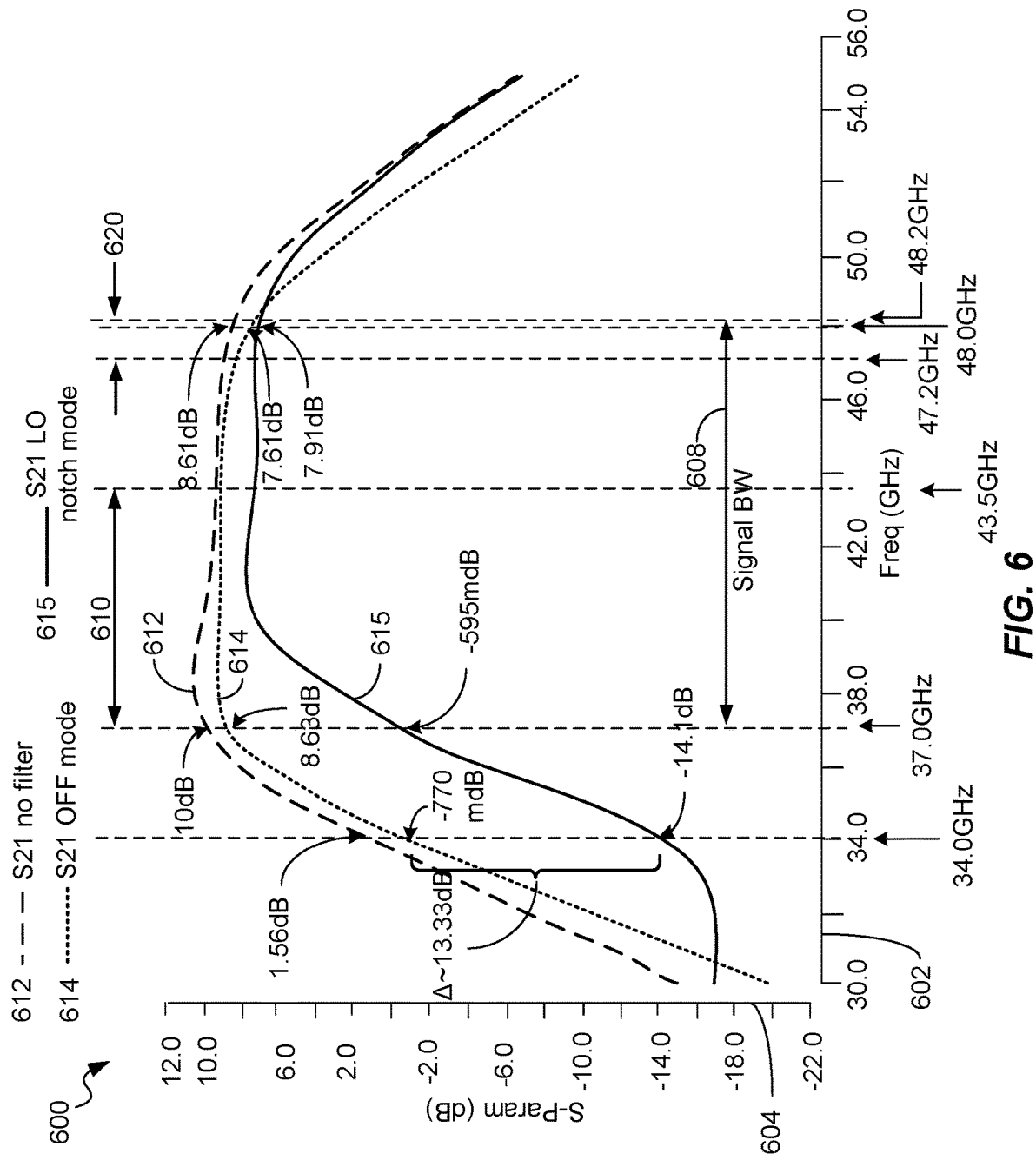
FIG. 6 is a graph showing exemplary state-dependent responses of the dual mode notch filter of FIG. 5.

FIG. 6 is a graph 600 showing exemplary state-dependent responses of the dual mode notch filter 550 of FIG. 5. The graph 600 includes a horizontal axis 602 showing frequency in GHz, increasing to the right; and a vertical axis 604 showing scattering parameter (S parameter) response. The exemplary S parameter response is the forward voltage gain (also referred to as Forward Transmission Coefficient, or S21 response). As shown above in FIG. 3, exemplary embodiments of the dual mode notch filter can be implemented in one or more locations along the transmit chain 300. All the exemplary S-parameter plots described herein are S21 (gain) of the exemplary embodiments of the dual mode notch filter together with several amplifier stages and several transformers, as shown for example in FIG. 3. The amplifier stages and transformers are consistent among the different traces shown in the drawings herein.

An exemplary signal bandwidth 608 is shown spanning from approximately 37 GHz to approximately 48.2 GHz. In an exemplary embodiment, the signal bandwidth 608 may include a first communication band 610 spanning approximately 37 GHz to 43.5 GHz, and a second communication band 620 spanning approximately 47.2 GHz to 48.2 GHz.

A trace 612 shows an exemplary S21 response where there is no dual mode notch filter implemented. A trace 614 shows an exemplary S21 response where the dual mode notch filter 550 of FIG. 5 is in OFF mode. A trace 615 shows an exemplary S21 response where the dual mode notch filter 550 of FIG. 5 is in LO notch mode.

As shown at 34 GHz, the S21 response when there is no dual mode notch filter implemented (trace 612) is approximately 1.56 dB; the S21 response when the dual mode notch filter 550 is implemented, but is in OFF mode (trace 614), is approximately −770 mdB; and the S21 response when the dual mode notch filter 550 is implemented, and is in LO notch mode (trace 615), is approximately −14.1 dB.

As shown by the traces 612 and 614, when the dual mode notch filter 550 is OFF (switch 558 ON, filter OFF, trace 614), there is a negligible effect on the signal at 37 GHz-48.2 GHz, for example, approximately 1.37 dB S21 difference between trace 612 and trace 614 at 37 GHz and approximately 1 dB difference between trace 612 and trace 614 at 48 GHz. Thus, a negligible effect may include a reduction of several dB or less. This allows the passage of a wide-bandwidth (>1.0 GHz) communication signal in the signal bandwidth 608.

As shown by the traces 614 and 615, when the dual mode notch filter 550 is in LO notch mode (switch 558 OFF, filter in LO notch mode, trace 615), there is a significant beneficial effect on spurious signal rejection at 34 GHz between trace 614 (−770 bdB) and trace 615 (−14.1 dB), resulting in approximately 13.33 dB LO rejection improvement in this example. Further, there are negligible effects on the signal at around 48 GHz.

The capacitances 556 and 557 (Co) (FIG. 5) and the capacitance 581 (Coff) (FIG. 5) added in shunt with the inductance 553 (FIG. 5) together are inductive at $\omega_{LO}$ and are open (high input impedance (Z)) at the signal frequency, and therefore the LO notch at 34 GHz, in this example, does not degrade a signal in the frequency of interest in the second communication band 620.

As shown by comparing the traces 614 and 615 at 34 GHz, there is an approximate 13.33 dB improvement in LO rejection at the LO frequency of 34 GHz when the dual mode notch filter 550 is enabled in LO notch mode.

In an exemplary embodiment, when the control signal, d_mode_ctrl is asserted and the switch 558 is ON (dual mode notch filter 550 is in OFF mode), the capacitance 556 and the capacitance 557 (Co, FIG. 5) is resonant with the inductance 553 at the signal frequency (37 GHz) and presents a high impedance (high Z) at the signal frequency in the 37 GHz-48.2 GHz band; therefore, the dual mode notch filter in OFF mode (trace 614) does not degrade a signal in the signal bandwidth 608. When the control signal, d_mode_ctrl is de-asserted and the switch 558 is OFF (dual mode notch filter 550 in LO notch mode), the equivalent inductance of the capacitances 556 and 557 (Co), the capacitance 581 (Coff) and the inductance 553 is inductive at the LO frequency (34 GHz) and is resonant with the capacitances 554 and 555 (Cn) at the LO frequency (34 GHz), thus, creating the LO notch at 34 GHz in this example. The capacitances 556 and 557 (Co) in series with the capacitance 581 (Coff) are resonant with the inductance 553 at the signal frequency (~'48 GHz) and presents a high impedance (high Z) at the signal frequency in the 48 GHz band (the second communication band 620); therefore, the LO notch response does not degrade a signal at the desired 48 GHz signal frequency.

In this manner, a 34 GHz LO signal will be significantly rejected when the dual mode notch filter 550 is in LO notch mode, without affecting a communication signal in the second communication band 620. Further, the dual mode notch filter 550 can be in OFF mode, without affecting a communication signal in the signal bandwidth 608 including the communication band 610 and the communication band 620.

Figure 7:
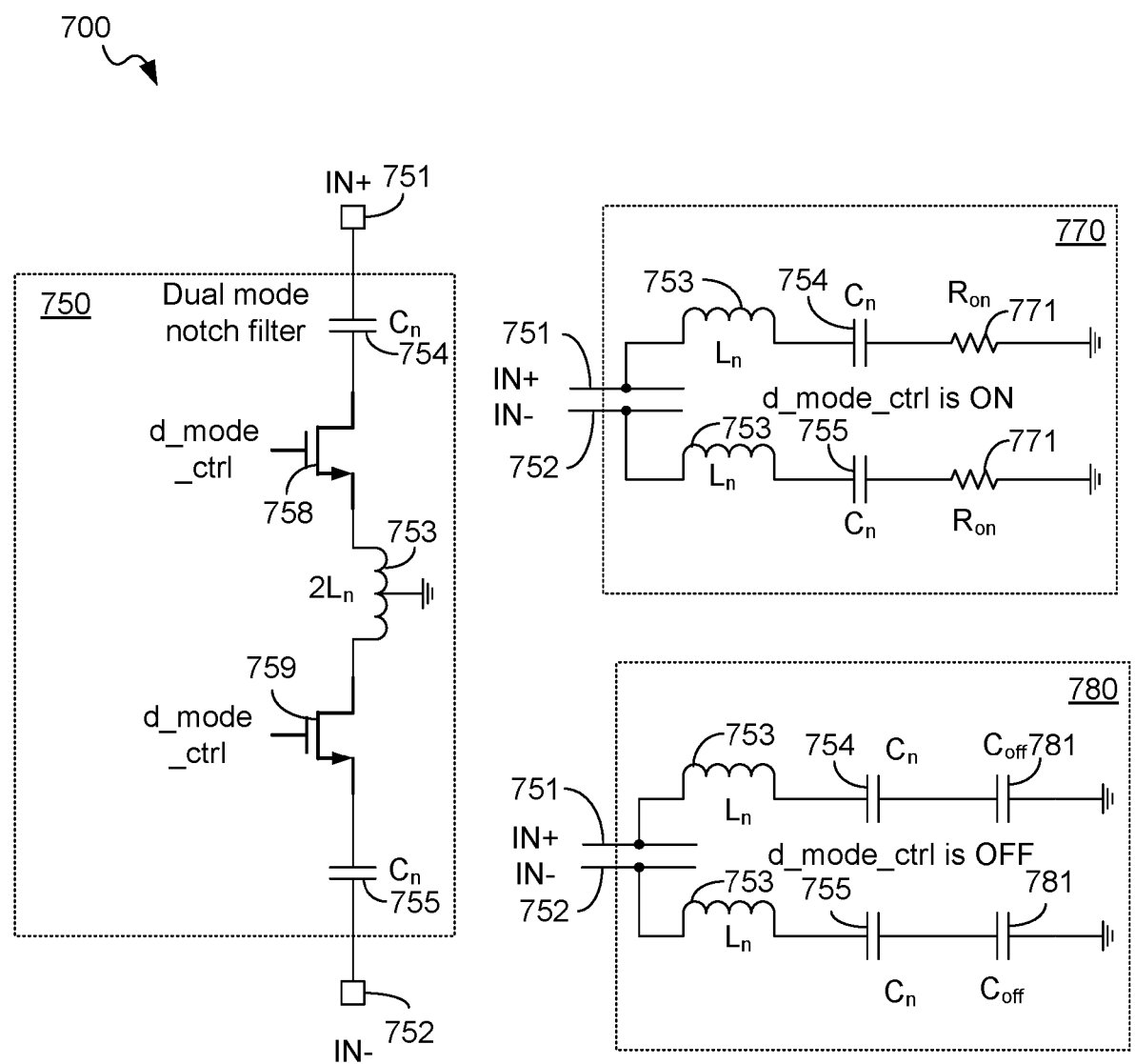
FIG. 7 is a schematic diagram showing a dual mode notch filter in accordance with an exemplary embodiment of the disclosure.

FIG. 7 is a schematic diagram 700 showing a dual mode notch filter in accordance with an exemplary embodiment of the disclosure. In an exemplary embodiment, a dual mode notch filter 750 may be implemented in a differential communication system and may comprise a capacitance 754 coupled to a positive input terminal (IN+) 751 and a capacitance 755 coupled to a negative input terminal (IN−) 752. The capacitances 754 and 755 may be referred to as Cn. The value of Cn may be chosen based on operating frequency, desired filter response and a number of other parameters.

In an exemplary embodiment, a switch 758 may be coupled between the capacitance 754 and an inductance 753. In an exemplary embodiment, the switch 758 may be implemented in a variety of ways, including as a metal oxide semiconductor (MOS) transistor device. In an exemplary embodiment, the switch 758 may be implemented as an n-type MOS (NMOS) transistor device or a p-type MOS (PMOS) transistor device, and is shown as an NMOS transistor device in this example. Other technologies may also be used to implement the switch 758.

In an exemplary embodiment, a switch 759 may be coupled between the capacitance 755 and the inductance 753. In an exemplary embodiment, the switch 759 may be implemented in a variety of ways, including as a metal oxide semiconductor (MOS) transistor device. In an exemplary embodiment, the switch 759 may be implemented as an n-type MOS (NMOS) transistor device or a p-type MOS (PMOS) transistor device, and is shown as an NMOS transistor device in this example. Other technologies may also be used to implement the switch 759.

The inductance 753 is coupled between the switch 758 and the switch 759. An exemplary value of the inductance 753 may be 2Ln, where the value of Ln may be chosen based on operating frequency, desired filter response and a number of other parameters. In an exemplary embodiment, a center tap of the inductance 753 may be coupled to system ground, and the inductance 753 may be referred to as a center-tapped inductance.

In an exemplary embodiment, the switch 758 and the switch 759 may be configured to receive a control signal, d_mode_ctrl, at their respective gates. The control signal, d_mode_ctrl may be provided by the data processor 210 of FIG. 2, or by another control element. Depending on the state of the control signal, d_mode_ctrl, the switch 758 and the switch 759 will be either conductive (ON) or non-conductive (OFF).

In the exemplary embodiment shown in FIG. 7, the drain of the switch 758 is coupled to the positive input terminal (IN+) 751 through the capacitance 754 and the source of the switch 758 is coupled to the inductance 753. In the exemplary embodiment shown in FIG. 7, the drain of the switch 759 is coupled to the inductance 753 and the source of the switch 759 is coupled to the negative input terminal (IN−) 752 through the capacitance 755.

Also shown in FIG. 7 are equivalent circuits corresponding to the state of the switch 758 and the state of the switch 759. A first equivalent circuit 770 shows the electrical arrangement of the dual mode notch filter 750 when the switch 758 and the switch 759 are conductive (ON), that is, when the control signal, d_mode_ctrl is asserted and the switch 758 and the switch 759 are conductive (ON); and a second equivalent circuit 780 shows the electrical arrangement of the dual mode notch filter 750 when the switch 758 and the switch 759 are non-conductive (OFF), that is, when the control signal, d_mode_ctrl is de-asserted and the switch 758 and the switch 759 are non-conductive (OFF).

In an exemplary embodiment, when the switch 758 and the switch 759 are conductive (ON), the dual mode notch filter 750 is ON; and when the switch 758 and the switch 759 are non-conductive (OFF), the dual mode notch filter 750 is OFF.

In the exemplary embodiment of FIG. 7, in a first mode, when the control signal, d_mode_ctrl is asserted and the switch 758 and the switch 759 are ON, the dual mode notch filter 750 may be configured to create a notch response at the exemplary LO frequency of 34 GHz.

In the exemplary embodiment of FIG. 7, in a second mode, when the control signal, d_mode_ctrl is de-asserted and the switch 758 and the switch 759 are OFF, the dual mode notch filter 750 may be configured to create a notch response at the exemplary 2LO frequency of 52 GHz.

In the first equivalent circuit 770, when the switch 758 and the switch 759 are ON, the switch 758 and the switch 759 appear as a resistance 771 with a value Ron. The on-resistance, Ron, of the switch 758 and the switch 759 is dependent on the size of the device from which the switch 758 and the switch 759 are fabricated, and the voltage applied to their respective gate, source and drain terminals. The value of Ron may be chosen based on circuit design considerations, operating frequency, and other factors.

In the second equivalent circuit 780, when the switch 758 and the switch 759 are OFF, the switch 758 and the switch 759 appear as a capacitance 781 with a value Coff. The off-capacitance, Coff, of the switch 758 and switch 759 is dependent on the size of the device from which the switch 758 and the switch 759 is fabricated, and the voltage applied to their respective gate, source and drain terminals. The value of Coff may be chosen based on circuit design considerations, operating frequency, and other factors. In this exemplary embodiment, when the switch 758 and the switch 759 are OFF and the dual mode notch filter 750 is in 2LO notch mode, the capacitance Coff and the capacitance Cn, together with the inductance, Ln, of the inductance 753, determine the notch response of the dual mode notch filter 750.

When the switch 758 and the switch 759 are ON:

$$L_n C_n = \frac{1}{\omega_{LO}^2}$$

$$Z_{in} = sL_n\left(1 - \frac{\omega_{LO}^2}{\omega^2}\right)$$

When the switch 758 and the switch 759 are OFF:

$$L_n \frac{C_n C_{off}}{C_n + C_{off}} = \frac{1}{\omega_{2LO}^2}$$

$$Z_{in} = \frac{1 - \frac{\omega_{2LO}^2}{\omega^2}}{s(C_n // C_{off})}$$

In an exemplary embodiment, when the control signal, d_mode_ctrl is ON, the inductance 753, Ln, resonates with the capacitance 754 and 755, Cn, at the LO frequency of 34 GHz, thus improving the LO rejection at 34 GHz for signals in the 48 GHz band.

In an exemplary embodiment, when the control signal, d_mode_ctrl is OFF, the capacitance 754 and 755, Cn, appears in series with the off-capacitance, Coff, of the switch 758 and the switch 759. The size of the switch 758 and the switch 759 is chosen to make the inductance 753, Ln, resonate with CnCoff/(Cn+Coff) at 2LO (52 GHz), thus improving the 2LO rejection at 52 GHz for signals in the 37 GHz-43.5 GHz band.

In an exemplary embodiment, the dual mode notch filter 750 is compact, uses a single inductance, 753, Ln, and also only relies on the off capacitance, Coff, of the switch 758 and the switch 759 and the capacitance, Cn, to either reject a signal at LO (34 GHz) or reject a signal at 2LO (52 GHz).

Figure 8:
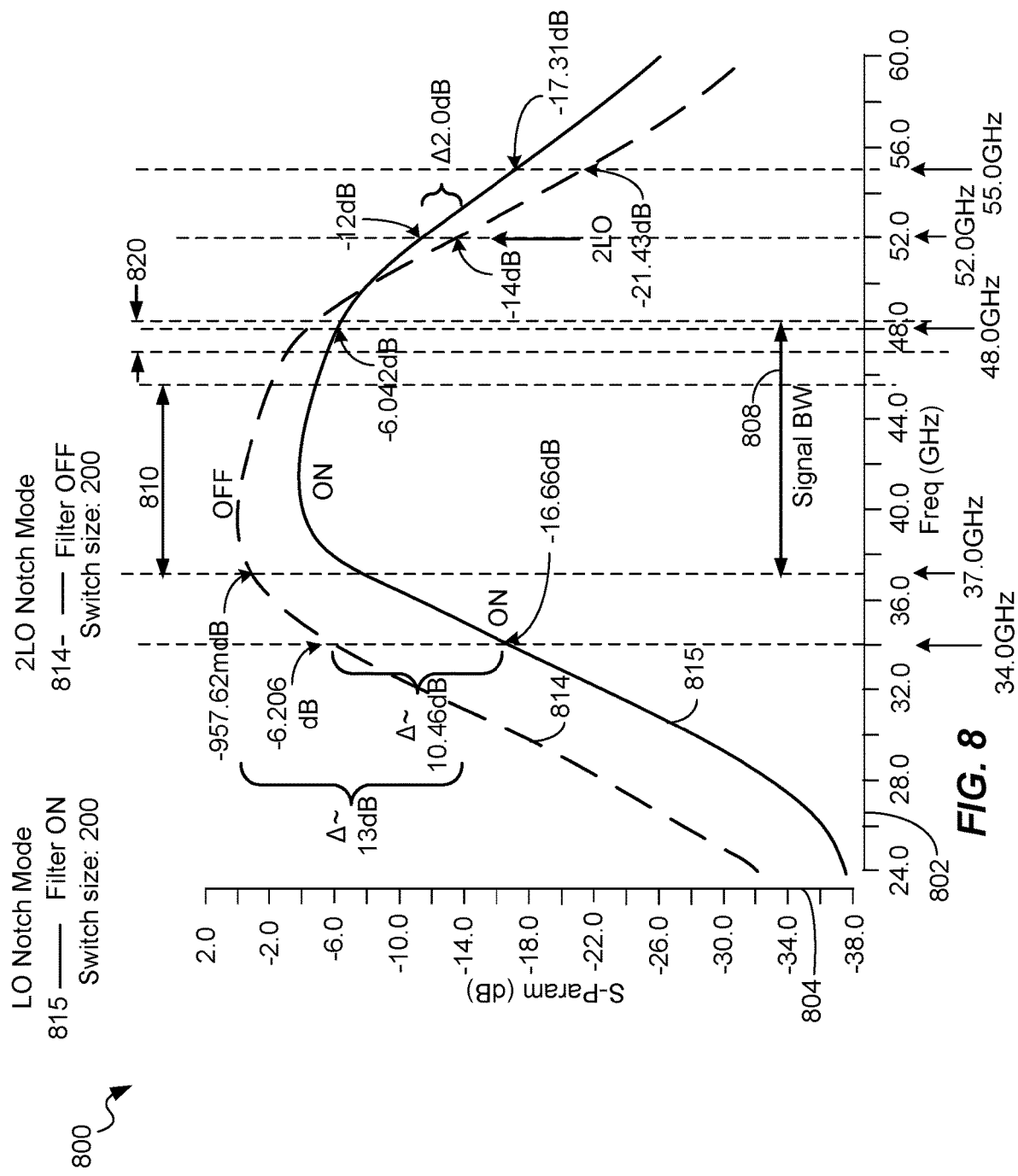
FIG. 8 is a graph showing exemplary state-dependent responses of the dual mode notch filter of FIG. 7.

FIG. 8 is a graph 800 showing exemplary state-dependent responses of the dual mode notch filter 750 of FIG. 7. The graph 800 includes a horizontal axis 802 showing frequency in GHz, increasing to the right; and a vertical axis 804 showing scattering parameter (S parameter) response. The exemplary S parameter response is the forward voltage gain (also referred to as Forward Transmission Coefficient, or S21 response).

An exemplary signal bandwidth 808 is shown spanning from approximately 37 GHz to approximately 48.2 GHz. In an exemplary embodiment, the signal bandwidth 808 may include a first communication band 810 spanning approximately 37 GHz to 43.5 GHz, and a second communication band 820 spanning approximately 47.2 GHz to 48.2 GHz.

A trace 814 shows an exemplary S21 response where the dual mode notch filter 750 of FIG. 7 is in OFF mode. A trace 815 shows an exemplary S21 response where the dual mode notch filter 750 of FIG. 7 is in ON mode.

In an exemplary embodiment, the absolute LO rejection is the delta (difference) between the gain at 34 GHz (LO) and the gain at 48 GHz (RF). In an exemplary embodiment, the absolute 2LO rejection is the delta (difference) between the gain at 52 GHz (2LO) and the gain at 37 GHz (RF). Comparing the gain difference between the two traces 814 (dual mode notch filter 750 of FIG. 7 in OFF mode) and 815 (dual mode notch filter 750 of FIG. 7 in ON mode) at the LO frequency and at the 2LO frequency can be used to illustrate the LO rejection improvement at 34 GHz and the 2LO rejection improvement at 52 GHz.

The trace 815 shows that when the control signal, d_mode_ctrl is asserted (ON), the dual mode notch filter 750 (FIG. 7) creates a notch response at the LO frequency of 34 GHz and the LO rejection is 10 dB, resulting in an approximate 10.46 dB LO rejection improvement between the two modes in this exemplary embodiment. The trace 815 also shows that the gain at 34 GHz is approximately −16.66 dB and the gain at 48 GHz is approximately −6 dB, leading to an approximate 10.46 dB absolute LO rejection.

The trace 814 shows that when the control signal, d_mode_ctrl is de-asserted (OFF), the dual mode notch filter 750 (FIG. 7) creates a notch response at the 2LO frequency of 52 GHz, resulting in an approximate 2 dB 2LO rejection improvement between the two modes at 52 GHz in this exemplary embodiment. The trace 814 also shows that the gain at 52 GHz is approximately −14.0 dB and the gain at 37 GHz is approximately −1 dB (−957.62 mdB), leading to an approximate 13 dB absolute 2LO rejection.

Moreover, exemplary embodiments of the dual mode notch filter 750 may be used to reject spurious signal energy at frequencies other than at the LO frequency and the 2LO frequency. For example, exemplary embodiments of the dual mode notch filter 750 may be used to reject spurious signal energy on either a lower frequency side or an upper frequency side of a communication signal band, such as at or near 37 GHz and at or near 43.5 GHz; or at or near 47.2 GHz and 48.2 GHz, for example only.

Figure 9:
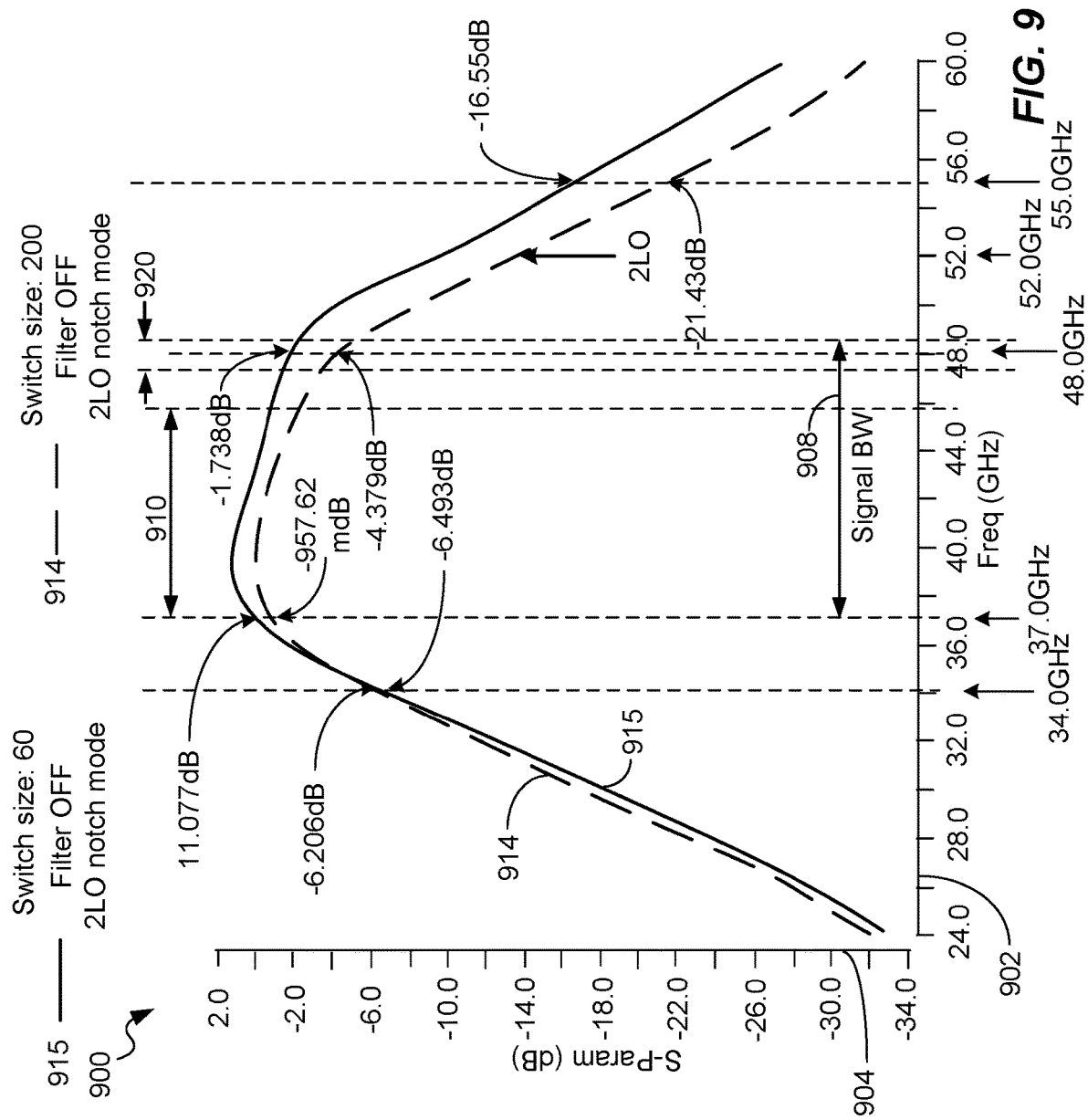
FIG. 9 is a graph showing exemplary switch size dependent responses of the dual mode notch filter of FIG. 7.

FIG. 9 is a graph 900 showing exemplary switch size dependent responses of the dual mode notch filter 750 of FIG. 7. The graph 900 includes a horizontal axis 902 showing frequency in GHz, increasing to the right; and a vertical axis 904 showing scattering parameter (S parameter) response. The exemplary S parameter response is the forward voltage gain (also referred to as Forward Transmission Coefficient, or S21 response).

An exemplary signal bandwidth 908 is shown spanning from approximately 37 GHz to approximately 48.2 GHz. In an exemplary embodiment, the signal bandwidth 908 may include a first communication band 910 spanning approximately 37 GHz to 43.5 GHz, and a second communication band 920 spanning approximately 47.2 GHz to 48.2 GHz.

A trace 914 shows an exemplary S21 response where the dual mode notch filter 750 of FIG. 7 is in OFF mode (dual mode notch filter in 2LO notch mode) and the size of the switch 758 and the size of the switch 759 (FIG. 7) corresponds to 60 μm, where in this example 60 corresponds to the number of fingers for the NMOS transistor. The equivalent switch size is referred to as 60 μm in this example.

A trace 915 shows an exemplary S21 response where the dual mode notch filter 750 of FIG. 7 is in OFF mode (dual mode notch filter in 2LO notch mode) and the size of the switch 758 and the size of the switch 759 (FIG. 7) corresponds to 200 μm, where in this example 200 corresponds to the number of fingers for the NMOS transistor. The equivalent switch size is referred to as 200 μm in this example.

As shown by comparing the trace 914 to the trace 915, increasing the size of the switch 758 and the switch 759 (FIG. 7) increases the off-capacitance, Coff, of the switches 758 and 759, thus reducing the notch frequency, which is particularly evident at or near the 2LO frequency of 52 GHz. For example, the larger the switch size, the larger the off-capacitance, Coff. A larger off-capacitance, Coff, lowers the frequency of the filter response for a given power such that at the 2LO notch frequency (52 GHz in this example) the rejection provided by the notch approaches the second communication band 920 (i.e., 48.2 GHz) and the rejection at 52 GHz improves. As shown in FIG. 9, the choice of switch size affects the filter performance and the operating frequency.

Figure 10:
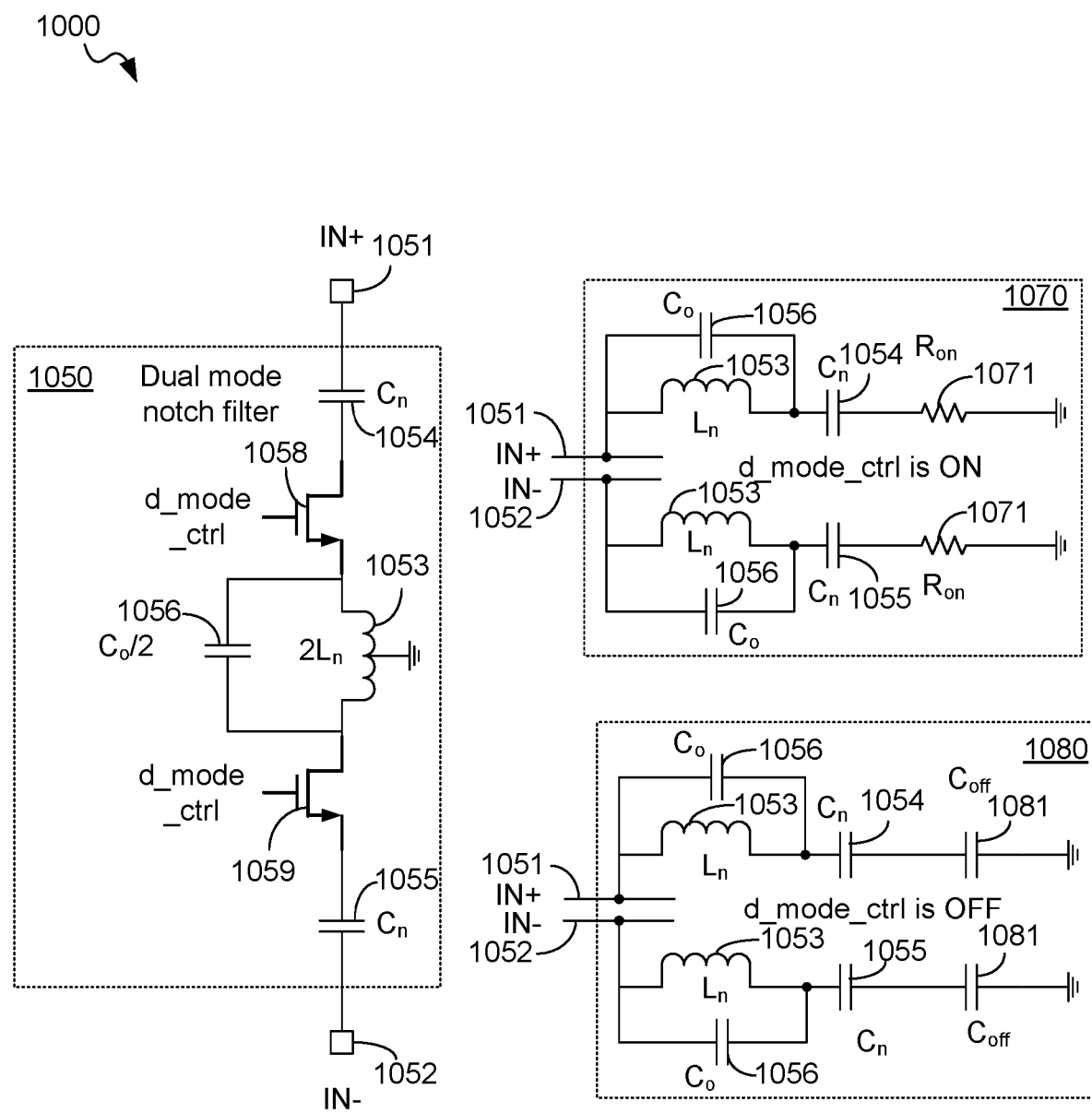
FIG. 10 is a schematic diagram showing a dual mode notch filter in accordance with an exemplary embodiment of the disclosure.

FIG. 10 is a schematic diagram 1000 showing a dual mode notch filter in accordance with an exemplary embodiment of the disclosure. In an exemplary embodiment, a dual mode notch filter 1050 may be implemented in a differential communication system and may comprise a capacitance 1054 coupled to a positive input terminal (IN+) 1051 and a capacitance 1055 coupled to a negative input terminal (IN−) 1052. The capacitances 1054 and 1055 may be referred to as Cn. The value of Cn may be chosen based on operating frequency, desired filter response and a number of other parameters.

In an exemplary embodiment, a switch 1058 may be coupled between the capacitance 1054 and an inductance 1053. In an exemplary embodiment, the switch 1058 may be implemented in a variety of ways, including as a metal oxide semiconductor (MOS) transistor device. In an exemplary embodiment, the switch 1058 may be implemented as an n-type MOS (NMOS) transistor device or a p-type MOS (PMOS) transistor device, and is shown as an NMOS transistor device in this example. Other technologies may also be used to implement the switch 1058.

In an exemplary embodiment, a switch 1059 may be coupled between the capacitance 1055 and the inductance 1053. In an exemplary embodiment, the switch 1059 may be implemented in a variety of ways, including as a metal oxide semiconductor (MOS) transistor device. In an exemplary embodiment, the switch 1059 may be implemented as an n-type MOS (NMOS) transistor device or a p-type MOS (PMOS) transistor device, and is shown as an NMOS transistor device in this example. Other technologies may also be used to implement the switch 1059.

The inductance 1053 is coupled between the switch 1058 and the switch 1059. An exemplary value of the inductance 1053 may be 2Ln, where the value of Ln may be chosen based on operating frequency, desired filter response and a number of other parameters. In an exemplary embodiment, a center tap of the inductance 1053 may be coupled to system ground, and the inductance 1053 may be referred to as a center-tapped inductance.

In an exemplary embodiment, a capacitance 1056 may be coupled in parallel across the inductance 1053. The capacitance 1056 may be referred to as Co/2. The value of Co may be chosen based on operating frequency, desired filter response and a number of other parameters.

In an exemplary embodiment, the switch 1058 and the switch 1059 may be configured to receive a control signal, d_mode_ctrl, at their respective gates. The control signal, d_mode_ctrl may be provided by the data processor 210 of FIG. 2, or by another control element. Depending on the state of the control signal, d_mode_ctrl, the switch 1058 and the switch 1059 will be either conductive (ON) or non-conductive (OFF).

In the exemplary embodiment shown in FIG. 10 the drain of the switch 1058 is coupled to the positive input terminal (IN+) 1051 through the capacitance 1054, and the source of the switch 1058 is coupled to the inductance 1053 and to the capacitance 1056. In the exemplary embodiment shown in FIG. 10, the drain of the switch 1059 is coupled to the inductance 1053 and to the capacitance 1056, and the source of the switch 1059 is coupled to the negative input terminal (IN−) 1052 through the capacitance 1055.

Also shown in FIG. 10 are equivalent circuits corresponding to the state of the switch 1058 and the state of the switch 1059. A first equivalent circuit 1070 shows the electrical arrangement of the dual mode notch filter 1050 when the switch 1058 and the switch 1059 are conductive (ON), that is, when the control signal, d_mode_ctrl is asserted and the switch 1058 and the switch 1059 are conductive (ON); and a second equivalent circuit 1080 shows the electrical arrangement of the dual mode notch filter 1050 when the switch 1058 and the switch 1059 are non-conductive (OFF), that is, when the control signal, d_mode_ctrl is de-asserted and the switch 1058 and the switch 1059 are non-conductive (OFF). In an exemplary embodiment, when the switch 1058 and the switch 1059 are conductive (ON), the dual mode notch filter 1050 is ON; and when the switch 1058 and the switch 1059 are non-conductive (OFF), the dual mode notch filter 1050 is OFF.

In the exemplary embodiment of FIG. 10, when the control signal, d_mode_ctrl is asserted (ON) and the switch 1058 and the switch 1059 are ON, the dual mode notch filter 1050 may be configured to create a notch response at the LO frequency of 34 GHz.

In the exemplary embodiment of FIG. 10, when the control signal, d_mode_ctrl is de-asserted (OFF) and the switch 1058 and the switch 1059 are OFF, the dual mode notch filter 1050 may be configured to have a negligible effect on a signal in the exemplary 37 GHz to 48.2 GHz communication bandwidth.

In the first equivalent circuit 1070, when the switch 1058 and the switch 1059 are ON, the switch 1058 and the switch 1059 appear as a resistance 1071 with a value Ron. The on-resistance, Ron, of the switch 1058 and the switch 1059 is dependent on the size of the device from which the switch 1058 and the switch 1059 are fabricated, and the voltage applied to their respective gate, source and drain terminals. The value of Ron may be chosen based on circuit design considerations, operating frequency, and other factors.

In the second equivalent circuit 1080, when the switch 1058 and the switch 1059 are OFF, the switch 1058 and the switch 1059 appear as a capacitance 1081 with a value Coff. The off-capacitance, Coff, 1081 of the switch 1058 and the switch 1059 is dependent on the size of the device from which the switch 1058 and the switch 1059 is fabricated, and the voltage applied to their respective gate, source and drain terminals. The value of Coff may be chosen based on circuit design considerations, operating frequency, and other factors.

In this exemplary embodiment, when the switch 1058 and the switch 1059 are OFF and the dual mode notch filter 1050 is OFF, the capacitance Coff 1081, the capacitances 1054 and 1055 (Cn), and the capacitance 1056 (Co), together with the inductance, Ln, of the inductance 1053, determine the response of the dual mode notch filter 1050.

In this exemplary embodiment, when the switch 1058 and the switch 1059 are ON and the dual mode notch filter 1050 is ON, the capacitance 1056 (Co) and the capacitances 1054 and 1055 (Cn), together with the inductance, Ln, of the inductance 1053, determine the response of the dual mode notch filter 1050.

In the dual mode notch filter 1050, the capacitance 1056 is shown as Co/2 and the inductance 1053 is shown as 2Ln for convenience such that in the equivalent circuits 1070 and 1080, the capacitance 1056 can be shown as Co and the inductance 1053 can be shown as Ln.

When the switch 1058 and the switch 1059 are ON:

$$L_n C_o = \frac{1}{\omega_o^2}$$

$$\frac{L_n}{1 - \frac{\omega_{LO}^2}{\omega_o^2}} C_n = \frac{1}{\omega_{LO}^2}$$

When the switch 1058 and the switch 1059 are OFF:

$$Z_{in} = \frac{1}{sC_n} + \frac{1}{sC_{off}} + \frac{sL_n}{1 - \frac{\omega^2}{\omega_o^2}}$$

In an exemplary embodiment, the dual mode notch filter 750 (FIG. 7) includes circuitry where the series combination of Ln and Cn (which resonates at LO=34 GHz) is substantially equivalent to a small inductor at approximately 48 GHz, causing significant loss at approximately 48 GHz.

In an exemplary embodiment shown in FIG. 10, adding a capacitance 1056 (Co), in parallel with the inductance, Ln, 1053 reduces signal loss at 48 GHz when the dual mode notch filter 1050 is ON, that is, in LO notch mode. In this example, the parallel combination of Ln and Co resonate at approximately 48 GHz. When the control signal, d_mode_ctrl, is asserted (ON), the equivalent inductance of Ln//Co (Ln in parallel with Co) resonates with Cn at the LO frequency of 34 GHz, thus improving LO signal leakage rejection. The value of Ln//Co (Ln in parallel with Co) presents a high impedance (high Z) at 48 GHz, thus minimizing the signal loss at 48 GHz caused by the LO notch response.

When the control signal, d_mode_ctrl, is de-asserted (OFF), CnCoff/(Cn+Coff) appears in series, together with the parallel combination of Ln//Co and creates a high impedance (high Z) for a signal at 37 GHz-48.2 GHz, thus the dual mode notch filter 1050 can be turned OFF in this embodiment to have negligible effect on a signal in the 37 GHz-48.2 GHz communication band.

In an exemplary embodiment, the dual mode notch filter 1050 can be configured to create a notch response at LO (34 GHz) while introducing minimal loss at 48 GHz (with the added Co) when ON; and can be turned completely OFF to have negligible effect on a signal at 37 GHz-48.2 GHz, while using only a single inductance 1053 and the switches 1058 and 1059.

Figure 11:
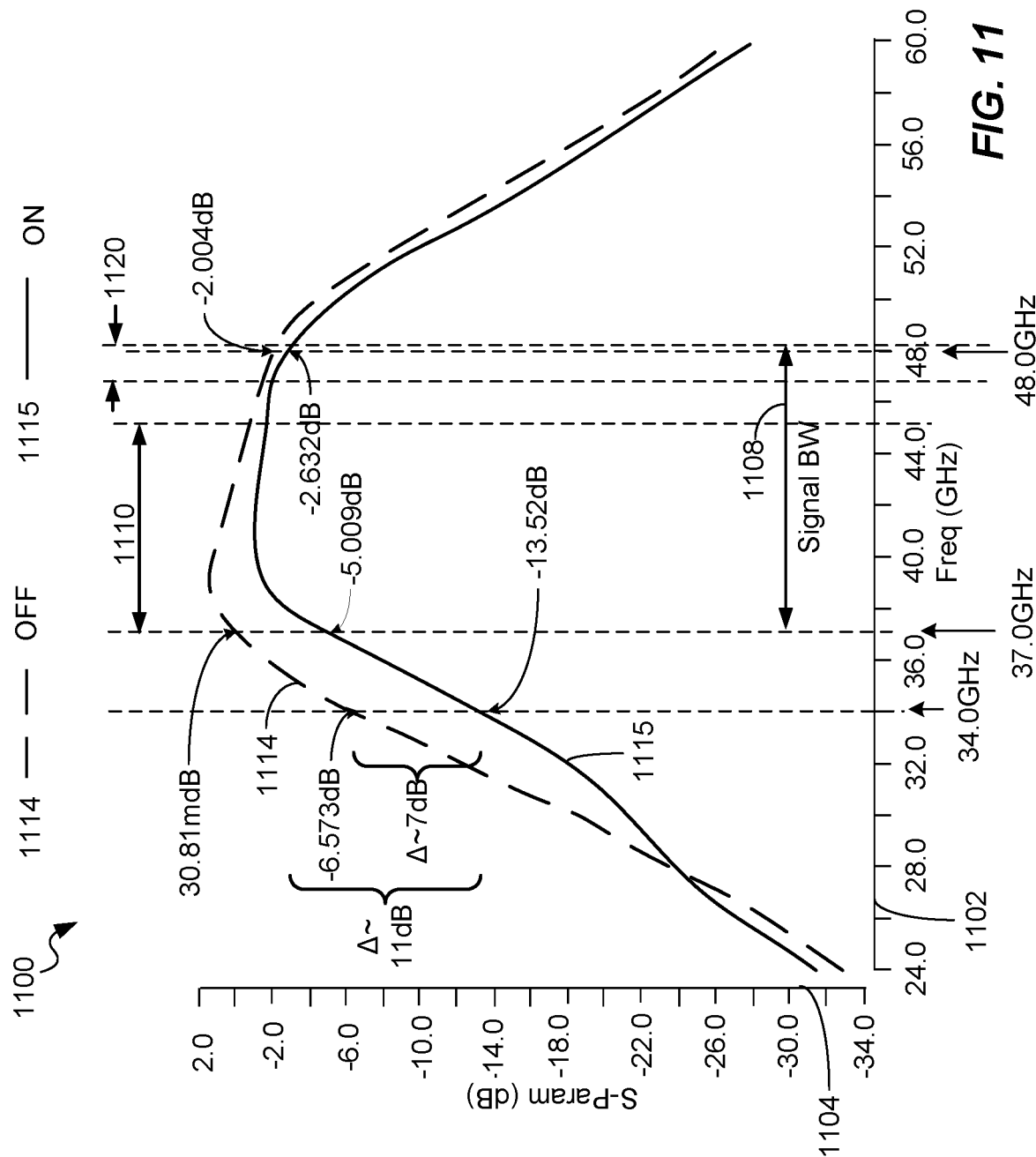
FIG. 11 is a graph showing exemplary state-dependent responses of the dual mode notch filter of FIG. 10.

FIG. 11 is a graph 1100 showing exemplary state-dependent responses of the dual mode notch filter 1050 of FIG. 10. The graph 1100 includes a horizontal axis 1102 showing frequency in GHz, increasing to the right; and a vertical axis 1104 showing scattering parameter (S parameter) response. The exemplary S parameter response is the forward voltage gain (also referred to as Forward Transmission Coefficient, or S21 response).

An exemplary signal bandwidth 1108 is shown spanning from approximately 37 GHz to approximately 48.2 GHz. In an exemplary embodiment, the signal bandwidth 1108 may include a first communication band 1110 spanning approximately 37 GHz to 43.5 GHz, and a second communication band 1120 spanning approximately 47.2 GHz to 48.2 GHz.

A trace 1114 shows an exemplary S21 response where the dual mode notch filter 1050 of FIG. 10 is in OFF mode. A trace 1115 shows an exemplary S21 response where the dual mode notch filter 1150 of FIG. 11 is in ON mode.

The trace 1115 shows that when the control signal, d_mode_ctrl is asserted (ON), the dual mode notch filter 1050 (FIG. 10) creates a notch response at the LO frequency of 34 GHz and the absolute LO rejection is approximately 11 dB. That is, the trace 1115 shows that the power at 48 GHz is approximately −2.632 dB and the power at 34 GHz (LO) is approximately −13.52 dB, leading to an approximate 11 dB absolute LO rejection. The extra loss caused by the dual mode notch filter 1050 at 48 GHz is approximately 0.6 dB (difference between −2.632 dB and −2.004 dB), as shown by comparing the trace 1114 and the trace 1115 at 48 GHz. The approximate 0.6 dB extra loss to the signal at 48 GHz is a tradeoff with regard to improving the LO rejection at 34 GHz by approximately 7 dB.

The trace 1114 shows that when the control signal, d_mode_ctrl is de-asserted (OFF), the dual mode notch filter 1050 (FIG. 10) creates a notch response at a higher frequency, for example >60 GHz, while a signal in the communication bandwidth of 37 GHz to 48.2 GHz is not affected by the dual mode notch filter 1050 in this mode. The trace 1114 and the trace 1115 show that there is an approximate 7 dB improvement in the LO rejection (34 GHz) between ON and OFF mode.

Figure 12:
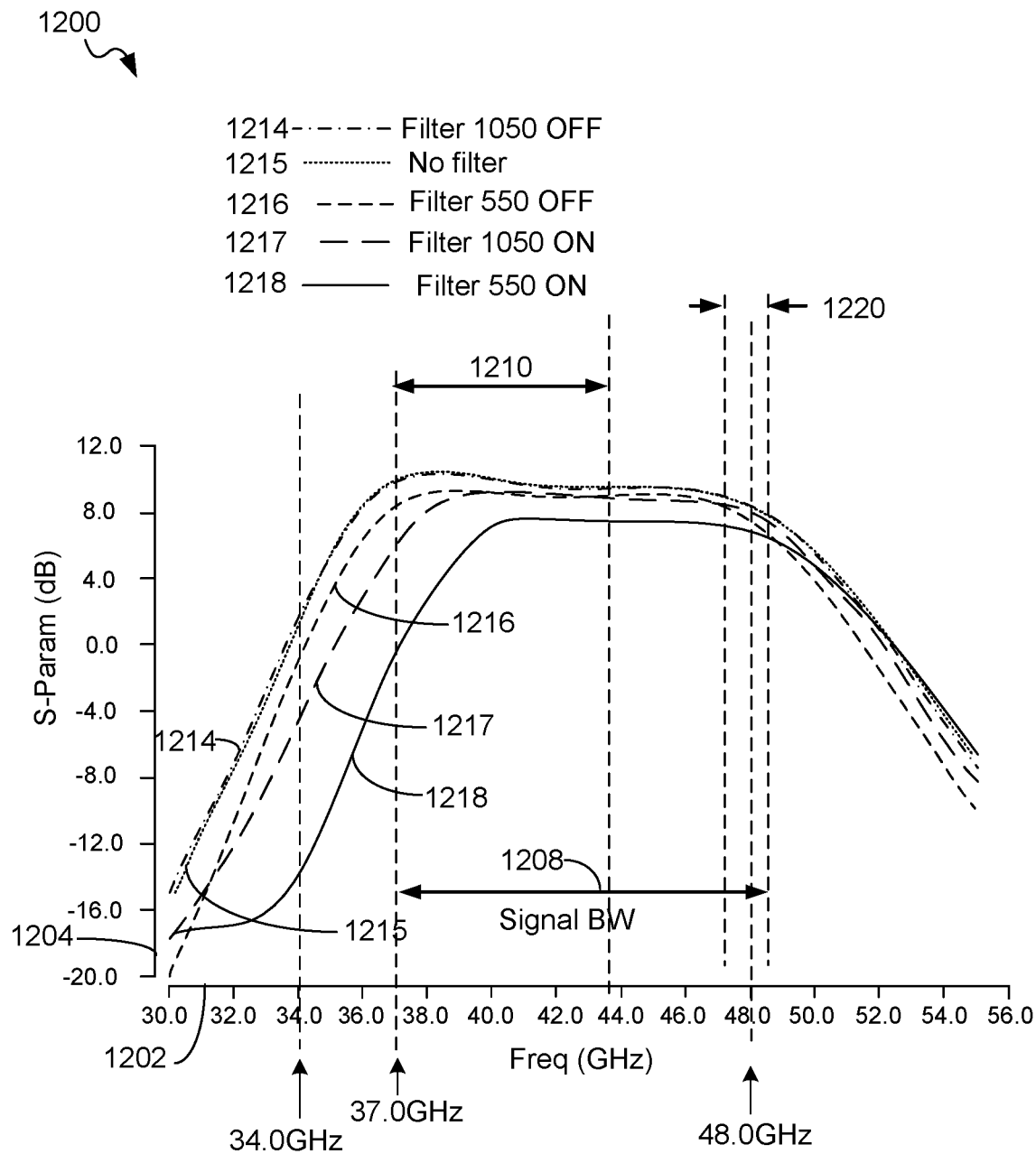
FIG. 12 is a graph showing exemplary state-dependent responses of the dual mode notch filter of FIG. 5, and the dual mode notch filter of FIG. 10.

FIG. 12 is a graph 1200 showing exemplary state-dependent responses of the dual mode notch filter 550 of FIG. 5, and the dual mode notch filter 1050 of FIG. 10. The graph 1200 includes a horizontal axis 1202 showing frequency in GHz, increasing to the right; and a vertical axis 1204 showing scattering parameter (S parameter) response. The exemplary S parameter response is the forward voltage gain (also referred to as Forward Transmission Coefficient, or S21 response).

An exemplary signal bandwidth 1208 is shown spanning from approximately 37 GHz to approximately 48 GHz. In an exemplary embodiment, the signal bandwidth 1208 may include a first communication band 1210 spanning approximately 37 GHz to 43.5 GHz, and a second communication band 1220 spanning approximately 47.2 GHz to 48.2 GHz.

With regard to the dual mode notch filter 1050 of FIG. 10, when the switches 1058 and 1059 are ON; then the LO notch response is enabled; and when the switches 1058 and 1059 are OFF, then the LO notch response is disabled. In this example, the dual mode notch filter 1050 exhibits lossy on-resistance, Ron, of the switch 1058 and the switch 1059, and limited LO trap rejection, but also exhibits negligible effect on a signal in the signal bandwidth 1208 (6 dB LO rejection improvement).

With regard to the dual mode notch filter 550 of FIG. 5, when the switch 558 is OFF; then the LO notch response is enabled; and when the switch 558 is ON, the LO notch response is disabled. In this example, the dual mode notch filter 550 exhibits lossy on-resistance, Ron, of the switch 558, and a gain drop for signals in the communication bandwidth 1208, but also exhibits better LO notch response rejection (13 dB LO rejection improvement, but 1.4 dB extra loss).

In FIG. 12, the trace 1215 shows the channel response when there is no dual mode notch filter implemented, the trace 1214 shows the channel response when the dual mode notch filter 1050 (FIG. 10) is in OFF mode; the trace 1217 shows the channel response when the dual mode notch filter 1050 (FIG. 10) is in ON mode; the trace 1216 shows the channel response when the dual mode notch filter 550 (FIG. 5) is in OFF mode; and the trace 1218 shows the channel response when the dual mode notch filter 550 (FIG. 5) is in ON mode.

Figure 13:
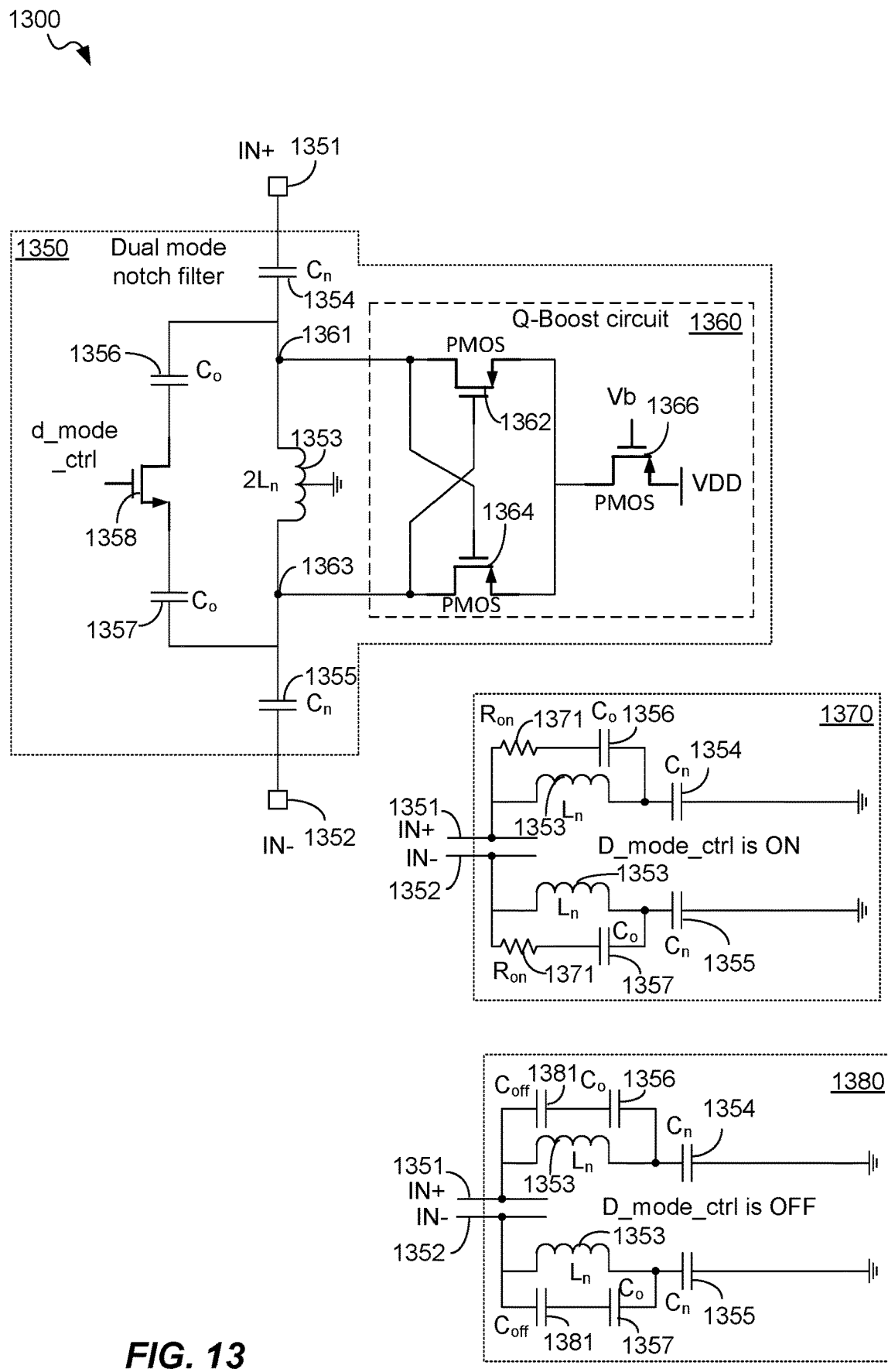
FIG. 13 is a schematic diagram showing a dual mode notch filter in accordance with an exemplary embodiment of the disclosure.

FIG. 13 is a schematic diagram 1300 showing a dual mode notch filter in accordance with an exemplary embodiment of the disclosure. In an exemplary embodiment, a dual mode notch filter 1350 may be a differential implementation and may comprise a capacitance 1354 coupled to a positive input terminal (IN+) 1351 and a capacitance 1355 coupled to a negative input terminal (IN−) 1352. The capacitances 1354 and 1355 may be referred to as Cn. The value of Cn may be chosen based on operating frequency, desired filter response and a number of other parameters.

An inductance 1353 is coupled between the capacitances 1354 and 1355. An exemplary value of the inductance 1353 may be 2Ln, where the value of Ln may be chosen based on operating frequency, desired filter response and a number of other parameters. In an exemplary embodiment, a center tap of the inductance 1353 may be coupled to system ground, and the inductance 1353 may be referred to as a center-tapped inductance.

In an exemplary embodiment, a switch 1358 may be coupled between capacitances 1356 and 1357, in parallel across the inductance 1353. In an exemplary embodiment, the switch 1358 may be implemented in a variety of ways, including as a metal oxide semiconductor (MOS) transistor device. In an exemplary embodiment, the switch 1358 may be implemented as an n-type MOS (NMOS) transistor device or a p-type MOS (PMOS) transistor device, and is shown as an NMOS transistor device in this example. Other technologies may also be used to implement the switch 1358.

The capacitances 1356 and 1357 may be referred to as Co. The value of Co may be chosen based on operating frequency, desired filter response and a number of other parameters.

The dual mode notch filter 1350 may be similar to the dual mode notch filter 550 of FIG. 5. In an exemplary embodiment, the dual mode notch filter 1350 may also include a Q-boost circuit 1360. The Q-boost circuit 1360 may be implemented to increase the quality factor, Q, of the dual mode notch filter 1350. The Q-boost circuit 1360 may include a transistor 1362, a transistor 1364 and a transistor 1366. In an exemplary embodiment, the transistor 1362, the transistor 1364 and the transistor 1366 may be implemented in a variety of ways, including using metal oxide semiconductor (MOS) transistor devices. In an exemplary embodiment, the transistor 1362, the transistor 1364 and the transistor 1366 may be implemented as an n-type MOS (NMOS) transistor device or a p-type MOS (PMOS) transistor device, and are shown as PMOS transistor devices in this example. Other technologies may also be used to implement the transistor 1362, the transistor 1364 and the transistor 1366. In an exemplary embodiment, the drain of the transistor 1362 may be coupled to a node 1361 between the capacitance 1354 and the inductance 1353, and the drain of the transistor 1364 may be coupled to a node 1363 between the capacitance 1355 and the inductance 1353. The source of the transistor 1362 and the source of the transistor 1364 may be coupled to the drain of the transistor 1366. The source of the transistor 1366 may be coupled to a system voltage, VDD. The gate of the transistor 1366 may be configured to receive a bias signal, Vb, from a controller, such as the data processor 210 of FIG. 2, or from another control element. In an exemplary embodiment, the bias signal, Vb, may range from zero volts to one (1) volt or slightly less.

In an exemplary embodiment, the gate of the transistor 1362 may be coupled to the drain of the transistor 1364, and the gate of the transistor 1364 may be coupled to the drain of the transistor 1362. In an exemplary embodiment, the Q-boost circuit 1360 generates a negative resistance (negative gm) to compensate for loss of the switch 1358. The bias signal, Vb, may be asserted when the switch 1358 is ON, that is, when the control signal, d_mode_ctrl is asserted (ON). The voltage level of the bias signal, Vb, may control the amount of negative gm generated by the Q-boost circuit 1360. In an exemplary embodiment, the Q-boost circuit 1360 may comprise a pair of transistors 1362 and 1364 coupled across the winding of the inductance 1353 of a double-tuned transformer, such as any of the transformers 310, 312, 314 and 316 of FIG. 3A. In an exemplary embodiment, the drain of each transistor 1362 and 1364 of the pair of transistors 1362 and 1364 is coupled to opposite sides of the winding of the inductance 1353 of a double-tuned transformer, such as any of the transformers 310, 312, 314 and 316 of FIG. 3A.

In an exemplary embodiment, the switch 1358 may be configured to receive a control signal, d_mode_ctrl, at its gate. The control signal, d_mode_ctrl may be provided by the data processor 210 of FIG. 2, or by another control element. Depending on the state of the control signal, d_mode_ctrl, the switch 1358 will be either conductive (ON) or non-conductive (OFF).

In the exemplary embodiment shown in FIG. 13, the drain of the switch 1358 is coupled to the capacitance 1356 and the source of the switch 1358 is coupled to the capacitance 1357.

Also shown in FIG. 13 are equivalent circuits corresponding to the state of the switch 1358. A first equivalent circuit 1370 shows the electrical arrangement of the dual mode notch filter 1350 when the switch 1358 is conductive (ON), that is, when the control signal, d_mode_ctrl is asserted and the switch 1358 is conductive (ON); and a second equivalent circuit 1380 shows the electrical arrangement of the dual mode notch filter 1350 when the switch 1358 is non-conductive (OFF), that is, when the control signal, d_mode_ctrl is de-asserted and the switch 1358 is non-conductive (OFF).

In an exemplary embodiment, when the switch 1358 is conductive (ON), the dual mode notch filter 1350 is OFF; and when the switch 1358 is non-conductive (OFF), the dual mode notch filter 1350 is ON, also referred to as being in LO notch mode.

In the first equivalent circuit 1370, when the switch 1358 is ON, the switch 1358 appears as a resistance 1371 with a value Ron. The on-resistance, Ron, of the switch 1358 is dependent on the size of the device from which the switch 1358 is fabricated, and the voltage applied to its gate, source and drain terminals. The value of Ron may be chosen based on circuit design considerations, operating frequency, and other factors.

In the second equivalent circuit 1380, when the switch 1358 is OFF, the switch 1358 appears as a capacitance 1381 with a value Coff. The off-capacitance, Coff, of the switch 1358 is dependent on the size of the device from which the switch 1358 is fabricated, and the voltage applied to its gate, source and drain terminals. The value of Coff may be chosen based on circuit design considerations, operating frequency, and other factors.

In this exemplary embodiment, when the switch 1358 is OFF and the dual mode notch filter 1350 is in LO notch mode, the capacitance Coff and the capacitance Co, together with the inductance, Ln, of the inductance 1353, and the capacitances 1354 and 1355 (Cn) determine the notch response of the dual mode notch filter 1350.

In this exemplary embodiment, when the switch 1358 is ON and the dual mode notch filter 1350 is OFF, the capacitance Co, together with the inductance, Ln, of the inductance 1353, and the capacitances 1354 and 1355 (Cn) determine the response of the dual mode notch filter 1350.

When the switch 1358 is ON:

$$Z_{in} \text{ is open/high at } \omega \sim \omega_o$$

$$L_n C_o = \frac{1}{\omega_o^2}$$

$$Z_{in} = \frac{1}{sC_n} + \frac{sL_n}{1 - \frac{\omega^2}{\omega_o^2}}$$

When the switch 1358 is OFF:

$$\omega_{off} > \omega_o, Z_{in} \text{ is short at } \omega_{LO}, Z_{in} \text{ is open/high at } \omega \sim \omega_{off}$$

$$L_n \frac{2 C_o C_{off}}{C_o + 2 C_{off}} = \frac{1}{\omega_{off}^2}$$

$$\frac{L_n}{1 - \frac{\omega_{LO}^2}{\omega_{off}^2}} C_n = \frac{1}{\omega_{LO}^2}$$

$$Z_{in} = \frac{1}{sC_n} + \frac{sL_n}{1 - \frac{\omega^2}{\omega_{off}^2}}$$

In an exemplary embodiment, when the control signal, d_mode_ctrl is asserted and the switch 1358 is ON (the dual mode notch filter 1350 is OFF), the parallel combination of Ln and Co resonates at approximately 48 GHz, and the dual mode notch filter 1350 appears as a high impedance (high Z) from 37 GHz to 48.2 GHz.

In an exemplary embodiment, when the control signal, d_mode_ctrl is de-asserted and the switch 1358 is OFF (the dual mode notch filter 1350 is ON), the equivalent inductance, L, of the parallel combination of Ln//C1 (C1 being the equivalent capacitance of Co and Coff in series) resonates with Cn at the LO frequency of 34 GHz, and the dual mode notch filter 1350 is in LO notch mode.

Figure 14B:
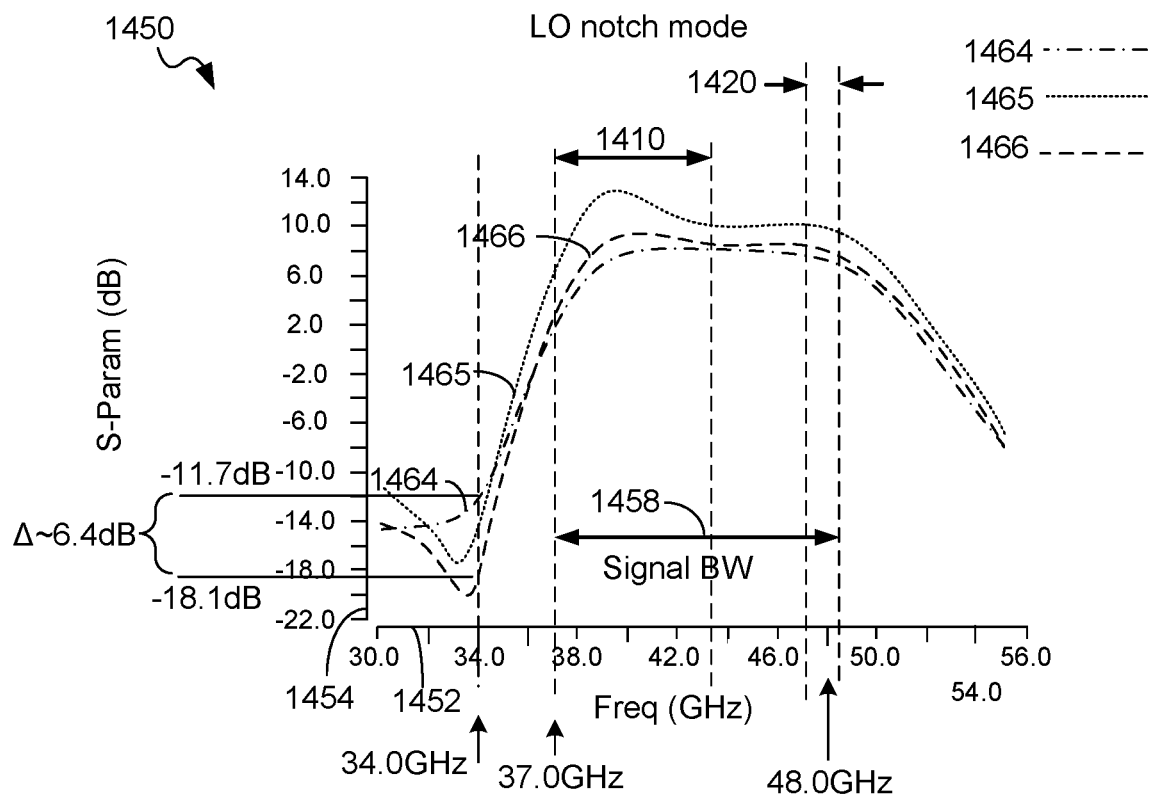
FIG. 14B is a graph showing exemplary bias voltage-dependent filter responses when the dual mode notch filter of FIG. 13 is in ON mode.
Figure 14A:
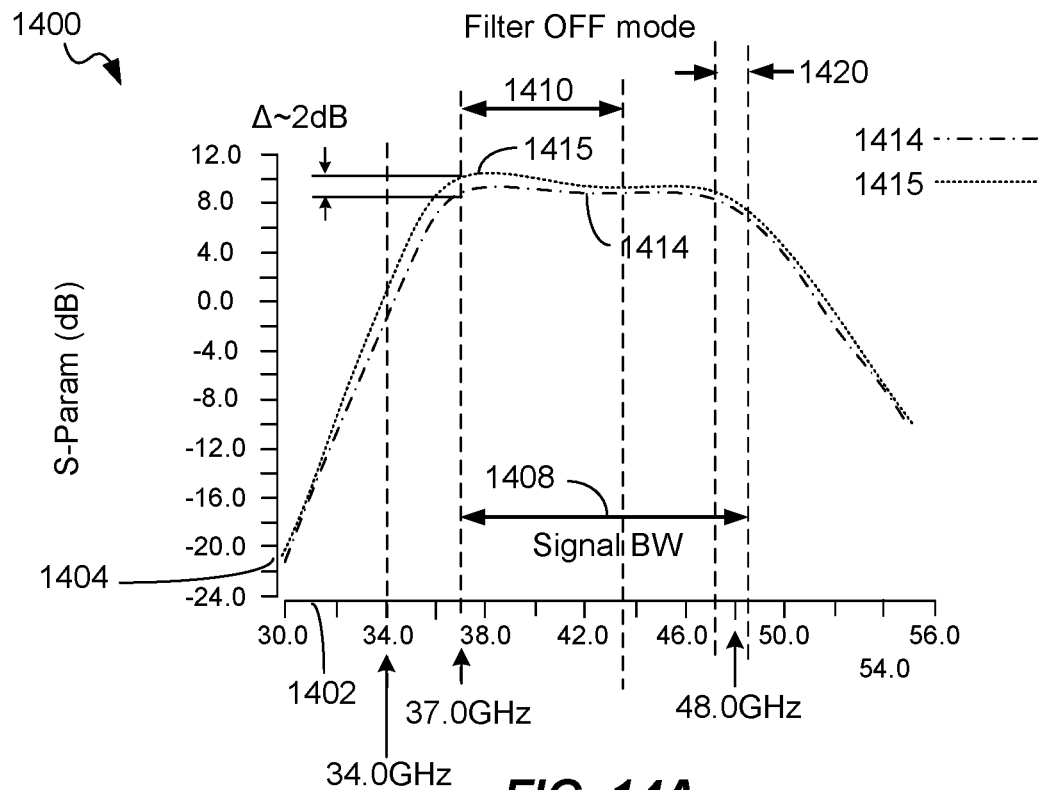
FIG. 14A is a graph showing exemplary bias voltage-dependent filter responses when the dual mode notch filter of FIG. 13 is in OFF mode.

FIG. 14A and FIG. 14B are graphs showing exemplary bias voltage-dependent filter responses (Vb) of the dual mode notch filter 1350 of FIG. 13.

FIG. 14A is a graph 1400 showing exemplary bias voltage-dependent filter responses when the dual mode notch filter 1350 of FIG. 13 is in OFF mode.

FIG. 14B is a graph 1450 showing exemplary bias voltage-dependent filter responses when the dual mode notch filter 1350 of FIG. 13 is in ON mode.

In FIG. 14A, the graph 1400 includes a horizontal axis 1402 showing frequency in GHz, increasing to the right; and a vertical axis 1404 showing scattering parameter (S parameter) response. The exemplary S parameter response is the forward voltage gain (also referred to as Forward Transmission Coefficient, or S21 response).

An exemplary signal bandwidth 1408 is shown spanning from approximately 37 GHz to approximately 48.2 GHz. In an exemplary embodiment, the signal bandwidth 1408 may include a first communication band 1410 spanning approximately 37 GHz to 43.5 GHz, and a second communication band 1420 spanning approximately 47.2 GHz to 48.2 GHz.

The traces 1414 and 1415 show exemplary filter responses of the dual mode notch filter 1350 of FIG. 13 when the dual mode notch filter 1350 is in an OFF mode (the switch 1358 is ON), and corresponds to a range of bias voltages, Vb, of the transistor 1366 (FIG. 13) that can range from approximately zero (0) volts (VDD in the example in which the transistor 1366 is a PMOS device) to the tens or hundreds of millivolts (mV), and generally less than one (1) volt. In an exemplary embodiment in which the transistor 1366 (FIG. 13) is implemented as a PMOS transistor as shown in FIG. 13, a range of bias voltages, Vb, may span from VDD Volts to hundreds of mV less than VDD volts. The traces of FIG. 14A show how the lossy on-resistance of the switch 1358 and the loss of the inductance 1353 (when the switch 1358 is ON) of the dual mode notch filter 1350 of FIG. 13 may be compensated by the Vb controlled negative resistance (negative gm) provided by the Q-boost circuit 1360 (FIG. 13). The negative resistance provided by the Q-boost circuit 1360 (FIG. 13) is directly proportional to the bias current/bias voltage for a certain range of bias voltages. In an exemplary embodiment, the trace 1414 shows the channel response when the transistor 1366 of FIG. 13 is OFF (biased with VDD volts); and the trace 1415 shows the channel response when the transistor 1366 of FIG. 13 is biased (source-gate voltage) with hundreds of mV less than VDD volts. The larger the bias voltage of the transistor 1366 (FIG. 13), the more loss compensation provided by the Q-boost circuit 1360 (FIG. 13). Comparing the trace 1414 (transistor 1366 OFF) with the trace 1415 at an exemplary 37 GHz, the gain shown by the trace 1415 is improved by about 2 dB over the gain shown by trace 1414 by compensating the loss (on-resistance) of the transistor 1358 and the resistive loss of the inductance 1353 using the Q-boost circuit 1360 of FIG. 13.

In FIG. 14B, the graph 1450 includes a horizontal axis 1452 showing frequency in GHz, increasing to the right; and a vertical axis 1454 showing scattering parameter (S parameter) response. The exemplary S parameter response is the forward voltage gain (also referred to as Forward Transmission Coefficient, or S21 response).

An exemplary signal bandwidth 1458 is shown spanning from approximately 37 GHz to approximately 48.2 GHz.

The traces 1464, 1465, and 1466 show exemplary filter responses of the dual mode notch filter 1350 of FIG. 13 in an ON condition and correspond to bias voltages, Vb, of the transistor 1366 (FIG. 13) that can range from approximately zero (0) volts (VDD in the example in which the transistor 1366 is a PMOS device) to the tens or hundreds of millivolts (mV), and generally less than one (1) volt. In an exemplary embodiment in which the transistor 1366 (FIG. 13) is implemented as a PMOS transistor as shown in FIG. 13, a range of bias voltages, Vb, may span from VDD Volts to hundreds of mV less than VDD volts. The traces of FIG. 14B show how the loss of the switch 1358 of the dual mode notch filter 1350 of FIG. 13 may be compensated by the Vb controlled negative resistance (negative gm) provided by the Q-boost circuit 1360 (FIG. 13).

In an exemplary embodiment, the trace 1464 shows the channel response when the transistor 1366 of FIG. 13 is OFF (biased with VDD volts), the trace 1465 shows the channel response when the transistor 1366 of FIG. 13 is biased (source-gate voltage) ON with some hundreds of mV less than VDD volts) and the trace 1466 shows the channel response when the transistor 1366 of FIG. 13 is biased (source-gate voltage) with some other hundreds of mV less than VDD volts. The larger the bias voltage of the transistor 1366 (FIG. 13), the more loss compensation provided by the Q-boost circuit 1360 (FIG. 13). In LO notch mode, the rejection of the dual mode notch filter 1350 at a particular frequency (34 GHz in this example) depends on both the Q and the arrangement of the capacitances within the dual mode notch filter 1350. The Q-boost circuit 1360 improves the Q of the dual mode notch filter 1350, but also adds certain parasitic capacitances to the dual mode notch filter 1350 which are bias voltage dependent. In this exemplary embodiment, the trace 1466 has lower gain compared to trace 1465 at 34 GHz in this particular example. In a design example, the sizing of the PMOS transistors 1362, 1364 and 1366 (FIG. 13), and the bias current/voltage of the Q-boost circuit 1360 are typically designed with the dual mode notch filter 1350 to achieve optimum performance Comparing the trace 1464 (transistor 1366 OFF) with the trace 1466 (transistor 1366 biased with some hundreds of mV less than VDD volts) at 34 GHz, the LO rejection shown by the trace 1466 is improved by about 6.4 dB over the LO rejection shown by trace 1464 by compensating the loss (on-resistance) of the switch 1358 and the resistive loss of the inductance 1353 using the Q-boost circuit 1360 of FIG. 13.

Figure 15:
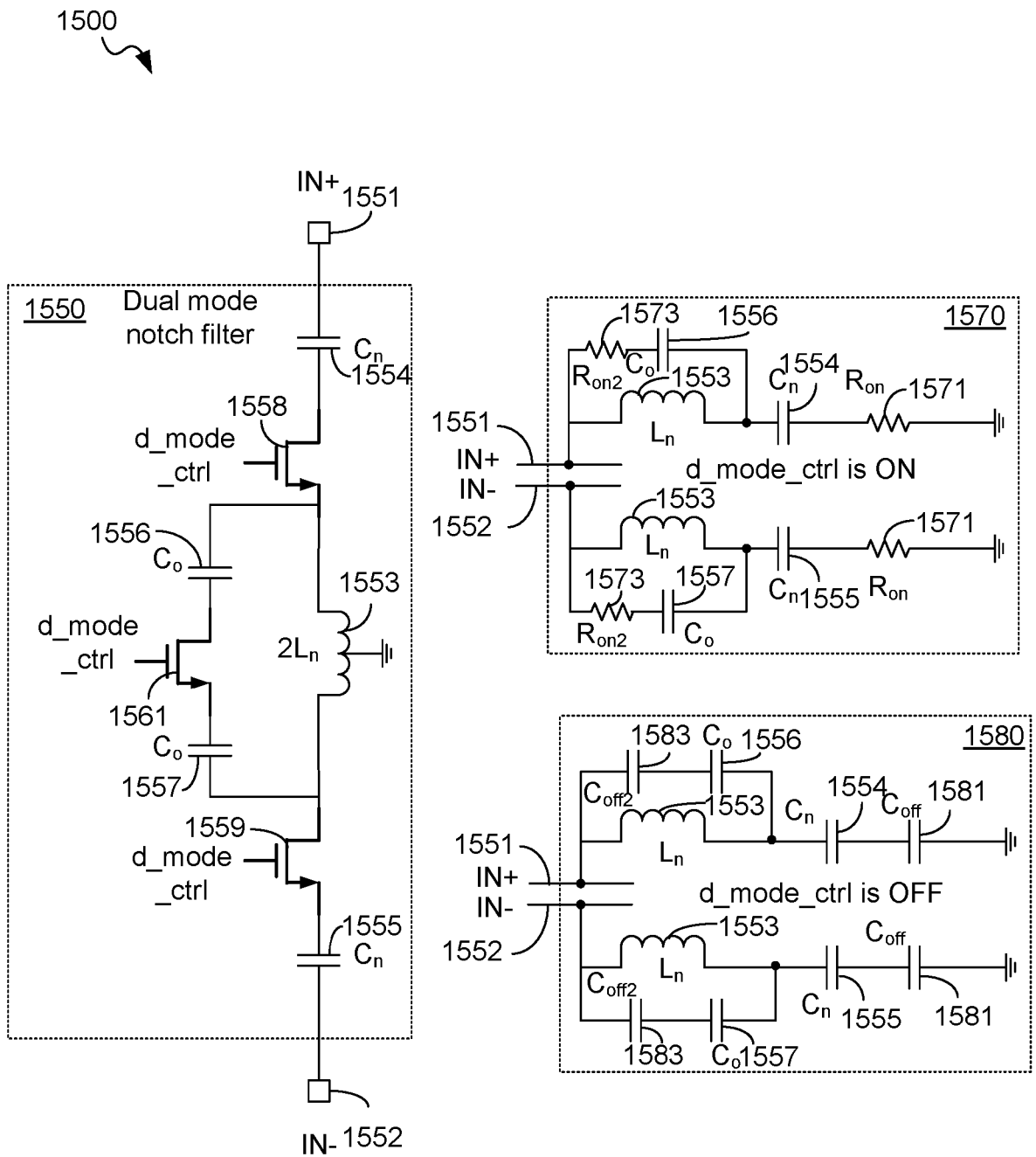
FIG. 15 is a schematic diagram showing a dual mode notch filter in accordance with an exemplary embodiment of the disclosure.

FIG. 15 is a schematic diagram 1500 showing a dual mode notch filter in accordance with an exemplary embodiment of the disclosure. In an exemplary embodiment, a dual mode notch filter 1550 may be implemented in a differential communication system and may comprise a capacitance 1554 coupled to a positive input terminal (IN+) 1551 and a capacitance 1555 coupled to a negative input terminal (IN−) 1552. The capacitances 1554 and 1555 may be referred to as Cn. The value of Cn may be chosen based on operating frequency, desired filter response and a number of other parameters.

In an exemplary embodiment, a switch 1558 may be coupled between the capacitance 1554 and an inductance 1553. In an exemplary embodiment, the switch 1558 may be implemented in a variety of ways, including as a metal oxide semiconductor (MOS) transistor device. In an exemplary embodiment, the switch 1558 may be implemented as an n-type MOS (NMOS) transistor device or a p-type MOS (PMOS) transistor device, and is shown as an NMOS transistor device in this example. Other technologies may also be used to implement the switch 1558.

In an exemplary embodiment, a switch 1559 may be coupled between the capacitance 1555 and the inductance 1553. In an exemplary embodiment, the switch 1559 may be implemented in a variety of ways, including as a metal oxide semiconductor (MOS) transistor device. In an exemplary embodiment, the switch 1559 may be implemented as an n-type MOS (NMOS) transistor device or a p-type MOS (PMOS) transistor device, and is shown as an NMOS transistor device in this example. Other technologies may also be used to implement the switch 1559.

The inductance 1553 is coupled between the switch 1558 and the switch 1559. An exemplary value of the inductance 1553 may be 2Ln, where the value of Ln may be chosen based on operating frequency, desired filter response and a number of other parameters.

In an exemplary embodiment, a capacitance 1556, a switch 1561, and a capacitance 1557 may be coupled in parallel across the inductance 1553. The capacitance 1556 and the capacitance 1557 may be referred to as Co. The value of Co may be chosen based on operating frequency, desired filter response and a number of other parameters.

In an exemplary embodiment, the switch 1561 may be implemented in a variety of ways, including as a metal oxide semiconductor (MOS) transistor device. In an exemplary embodiment, the switch 1561 may be implemented as an n-type MOS (NMOS) transistor device or a p-type MOS (PMOS) transistor device, and is shown as an NMOS transistor device in this example. Other technologies may also be used to implement the switch 1561.

In an exemplary embodiment, the switch 1558, the switch 1559 and the switch 1561 may be configured to receive a control signal, d_mode_ctrl, at their respective gates. The control signal, d_mode_ctrl may be provided by the data processor 210 of FIG. 2, or by another control element. Depending on the state of the control signal, d_mode_ctrl, the switch 1558, the switch 1561 and the switch 1559 will be either conductive (ON) or non-conductive (OFF).

In the exemplary embodiment shown in FIG. 15 the drain of the switch 1558 is coupled to the positive input terminal (IN+) 1551 through the capacitance 1554, and the source of the switch 1558 is coupled to the inductance 1553 and to the capacitance 1556. In the exemplary embodiment shown in FIG. 15, the drain of the switch 1559 is coupled to the inductance 1553 and to the capacitance 1557, and the source of the switch 1559 is coupled to the negative input terminal (IN−) 1552 through the capacitance 1555. In the exemplary embodiment shown in FIG. 15, the source of the switch 1561 is coupled to the capacitance 1557 and the drain of the switch 1561 is coupled to the capacitance 1556.

Also shown in FIG. 15 are equivalent circuits corresponding to the state of the switch 1558, the state of the switch 1559 and the state of the switch 1561. A first equivalent circuit 1570 shows the electrical arrangement of the dual mode notch filter 1550 when the switch 1558, the switch 1559 and the switch 1561 are conductive (ON), that is, when the control signal, d_mode_ctrl is asserted and the switch 1558, the switch 1559 and the switch 1561 are conductive (ON); and a second equivalent circuit 1580 shows the electrical arrangement of the dual mode notch filter 1550 when the switch 1558, the switch 1559 and the switch 1561 are non-conductive (OFF), that is, when the control signal, d_mode_ctrl is de-asserted and the switch 1558, the switch 1559 and the switch 1561 are non-conductive (OFF). In an exemplary embodiment, when the switch 1558, the switch 1559 and the switch 1561 are conductive (ON), the dual mode notch filter 1550 is ON and is in LO notch mode; and when the switch 1558, the switch 1559 and the switch 1561 are non-conductive (OFF), the dual mode notch filter 1050 is OFF and is in 2LO notch mode.

In the exemplary embodiment of FIG. 15, when the control signal, d_mode_ctrl is asserted (ON) and the switch 1558, the switch 1559 and the switch 1561 are ON, the dual mode notch filter 1550 may be configured to create a notch response at the LO frequency of 34 GHz.

In the exemplary embodiment of FIG. 15, when the control signal, d_mode_ctrl is de-asserted (OFF) and the switch 1558, the switch 1559 and the switch 1561 are OFF, the dual mode notch filter 1550 may be configured to create a notch response at the 2LO frequency of 52 GHz.

In the first equivalent circuit 1570, when the switch 1558, the switch 1559 and the switch 1561 are ON, the switch 1558 and the switch 1559 appear as a resistance 1571 with a value Ron. Similarly, the switch 1561 will appear as a resistance 1573 with a value Ron2. The on-resistance, Ron, of the switch 1558 and the switch 1559; and the on-resistance, Ron2, of the switch 1561 are dependent on the size of the device from which the switch 1558, the switch 1559 and the switch 1561 are fabricated, and the voltage applied to their respective gate, source and drain terminals. The value of Ron and the value of Ron2 may be chosen based on circuit design considerations, operating frequency, and other factors.

In the second equivalent circuit 1580, when the switch 1558, the switch 1559 and the switch 1561 are OFF, the switch 1558 and the switch 1559 appear as a capacitance 1581 with a value Coff. Similarly, the switch 1561 will appear as a capacitance 1583 with a value Coff2. The off-capacitance, Coff, 1581 of the switch 1558 and the switch 1559, and the off-capacitance, Coff2, 1583 of the switch 1561 is dependent on the size of the device from which the switch 1558, the switch 1559 and the switch 1561 is fabricated, and the voltage applied to their respective gate, source and drain terminals. The value of Coff and the value Coff2 may be chosen based on circuit design considerations, operating frequency, and other factors.

In this exemplary embodiment, when the switch 1558, the switch 1559 and the switch 1561 are OFF and the dual mode notch filter 1550 is in 2LO notch mode, the capacitance 1581 (Coff), the capacitances 1554 and 1555 (Cn), the capacitance 1583 (Coff2), and the capacitances 1556 and 1557 (Co), together with the inductance, Ln, of the inductance 1553, determine the response of the dual mode notch filter 1550.

In this exemplary embodiment, when the switch 1558, the switch 1559 and the switch 1561 are ON and the dual mode notch filter 1550 is in LO notch mode, the capacitance 1557 (Co), the capacitances 1554 and 1555 (Cn), together with the inductance, Ln, of the inductance 1553, determine the response of the dual mode notch filter 1550.

When the switch 1558, the switch 1559 and the switch 1561 are ON:

$$L_n C_o = \frac{1}{\omega_o^2}$$

$$Z_{in} = \frac{1}{sC_n} + \frac{sL_n}{1 - \frac{\omega^2}{\omega_o^2}}$$

$$\frac{L_n}{1 - \frac{\omega_{LO}^2}{\omega_o^2}} C_n = \frac{1}{\omega_{LO}^2}$$

When the switch 1558, the switch 1559 and the switch 1561 are OFF:

$$L_n \frac{2C_o C_{off2}}{C_o + 2C_{off2}} = \frac{1}{\omega_{off}^2}$$

$$\frac{L_n}{1 - \frac{\omega_{2LO}^2}{\omega_{off}^2}} \frac{C_n C_{off}}{C_n + C_{off}} = \frac{1}{\omega_{2LO}^2}$$

In an exemplary embodiment when the control signal, d_mode_ctrl is asserted (ON), the series combination of Ln and Co resonates at approximately 48.2 GHz, the parallel combination Ln//Co is inductive at the LO frequency of 34

GHz, and the equivalent inductance of Ln//Co (parallel combination of Ln and Co) resonates with Cn at the LO frequency (34 GHz) and creates the notch response at the LO frequency of 34 GHz. In this example, the parallel combination Ln//Co presents a high impedance (high Z) at 48.2 GHz, thus minimizing signal loss at 48 GHz, while presenting a notch response at the LO of 34 GHz.

In an exemplary embodiment when the control signal, d_mode_ctrl is de-asserted (OFF), CoCoff2/(Co+Coff2) is a smaller capacitance than when d_mode_ctrl is asserted (ON), which resonates with Ln at a frequency higher than the 2LO (52 GHz) frequency, Ln//(CoCoff2/(Co+Coff2)) is inductive at 2LO (52 GHz) and resonates with CnCoff/(cn+Coff) at 2LO creating a notch response at the 2LO frequency of 52 GHz.

In this manner, the loss at higher frequencies is minimized while creating the notch response for the LO frequency (34 GHz) in a first mode and also creating a notch response at the 2LO frequency (52 GHz) in a second mode.

Figure 16:
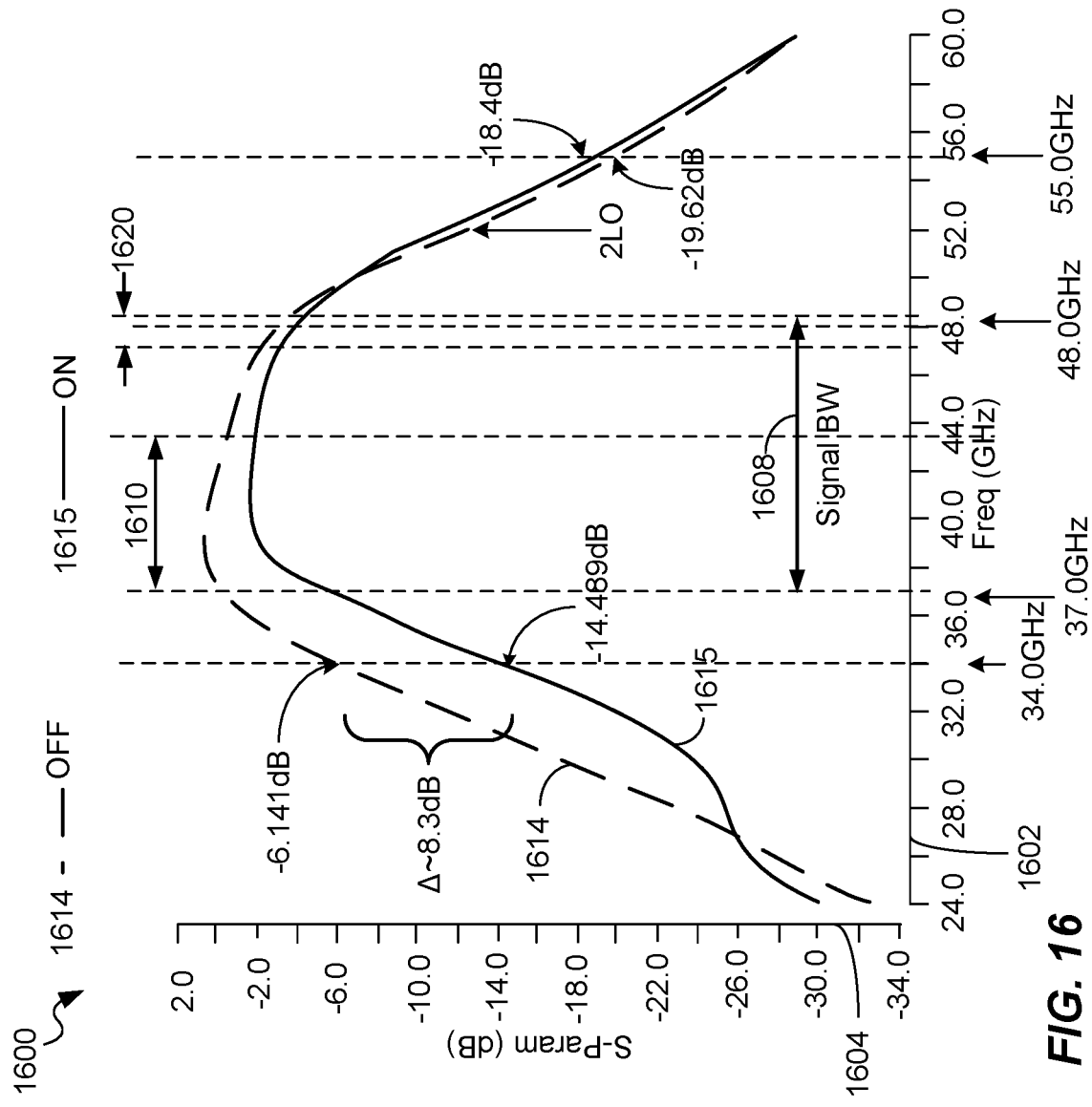
FIG. 16 is a graph showing exemplary state-dependent responses of the dual mode notch filter of FIG. 15.

FIG. 16 is a graph 1600 showing exemplary state-dependent responses of the dual mode notch filter 1550 of FIG. 15. The graph 1600 includes a horizontal axis 1602 showing frequency in GHz, increasing to the right; and a vertical axis 1604 showing scattering parameter (S parameter) response. The exemplary S parameter response is the forward voltage gain (also referred to as Forward Transmission Coefficient, or S21 response).

An exemplary signal bandwidth 1608 is shown spanning from approximately 37 GHz to approximately 48.2 GHz. In an exemplary embodiment, the signal bandwidth 1608 may include a first communication band 1610 spanning approximately 37 GHz to 43.5 GHz, and a second communication band 1620 spanning approximately 47.2 GHz to 48.2 GHz.

A trace 1614 shows an exemplary S21 response where the dual mode notch filter 1550 of FIG. 15 is in OFF mode.

A trace 1615 shows an exemplary S21 response where the dual mode notch filter 1550 of FIG. 15 is in ON mode.

The trace 1615 shows that when the control signal, d_mode_ctrl is asserted (ON), the dual mode notch filter 1550 (FIG. 15) creates a notch response at the ID frequency of 34 GHz and the LO rejection compared to when the dual mode notch filter 1550 (FIG. 15) is OFF (when the control signal, d_mode_ctrl is deasserted (OFF)) is approximately 8.3 dB; and the loss caused by the dual mode notch filter 1550 at 48 GHz is small.

The trace 1614 shows that when the control signal, d_mode_ctrl is de-asserted (OFF), the dual mode notch filter 1550 (FIG. 15) creates a notch response at approximately 55 GHz, while a signal at 37 GHz to 48.2 GHz is not affected by the dual mode notch filter 1550.

Figure 17:
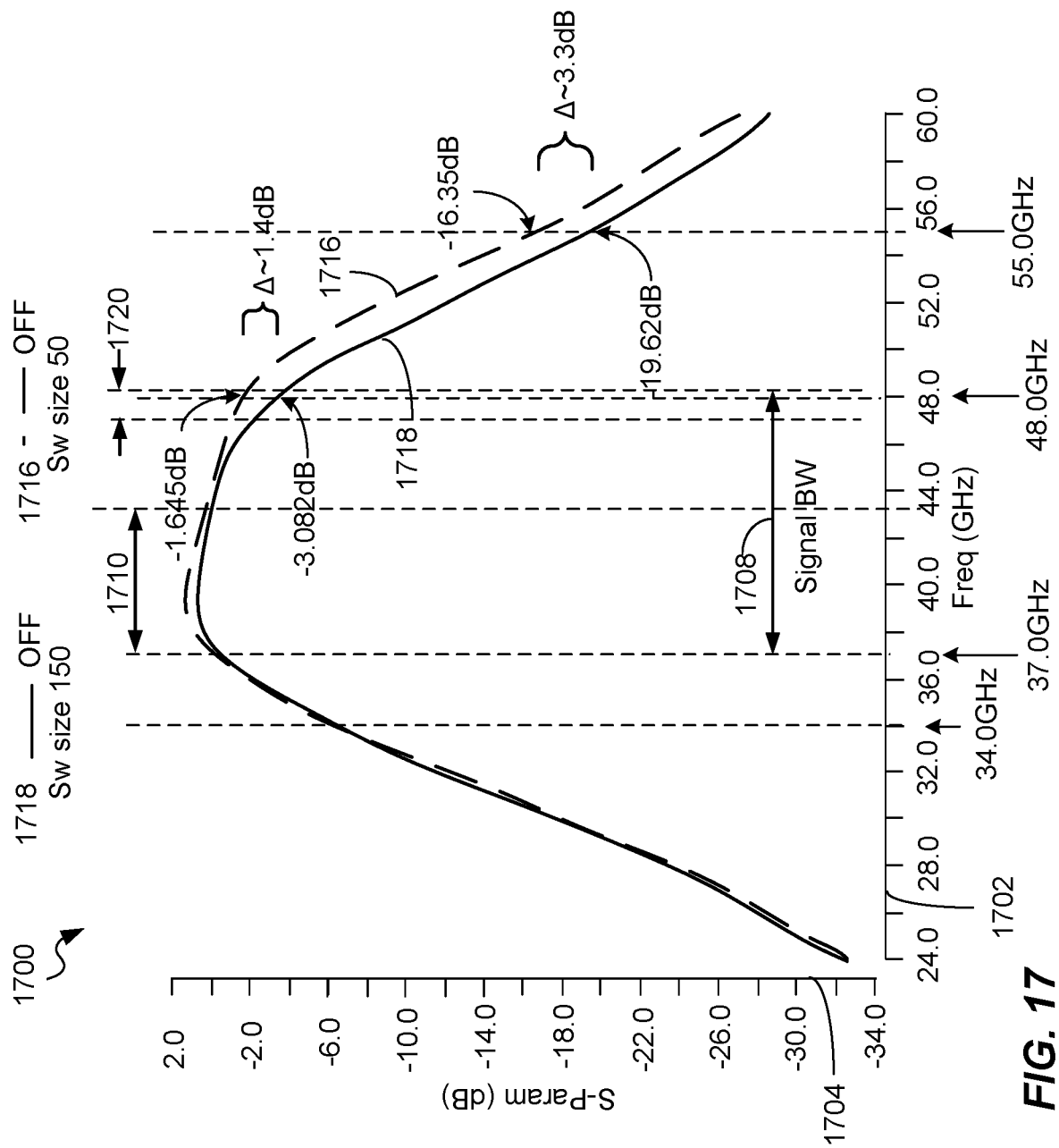
FIG. 17 is a graph showing exemplary switch size dependent responses of the dual mode notch filter of FIG. 15.

FIG. 17 is a graph 1700 showing exemplary switch size dependent responses of the dual mode notch filter 1550 of FIG. 15. The graph 1700 includes a horizontal axis 1702 showing frequency in GHz, increasing to the right; and a vertical axis 1704 showing scattering parameter (S parameter) response. The exemplary S parameter response is the forward voltage gain (also referred to as Forward Transmission Coefficient, or S21 response).

An exemplary signal bandwidth 1708 is shown spanning from approximately 37 GHz to approximately 48.2 GHz. In an exemplary embodiment, the signal bandwidth 1708 may include a first communication band 1710 spanning approximately 37 GHz to 43.5 GHz, and a second communication band 1720 spanning approximately 47.2 GHz to 48.2 GHz.

A trace 1716 shows an exemplary S21 response where the dual mode notch filter 1550 of FIG. 15 is in OFF mode and the size of the switch 1561 (FIG. 15) corresponds to 50 µm, where in this example 50 corresponds to the number of fingers for the NMOS transistor. The equivalent switch size is referred to as 50 µm in this example.

A trace 1718 shows an exemplary S21 response where the dual mode notch filter 1550 of FIG. 15 is in OFF mode and the size of the switch 1561 (FIG. 15) corresponds to 150 µm, where in this example 150 corresponds to the number of fingers for the NMOS transistor. The equivalent switch size is referred to as 150 µm in this example.

As shown by comparing the trace 1716 to the trace 1718, increasing the size of the switch 1561 (FIG. 15) increases the off-capacitance, Coff, of the switch 1558 and the switch 1559, thus improving the 2LO signal rejection (at 52 GHz) by approximately 3.3 dB in this exemplary embodiment.

Figure 18:
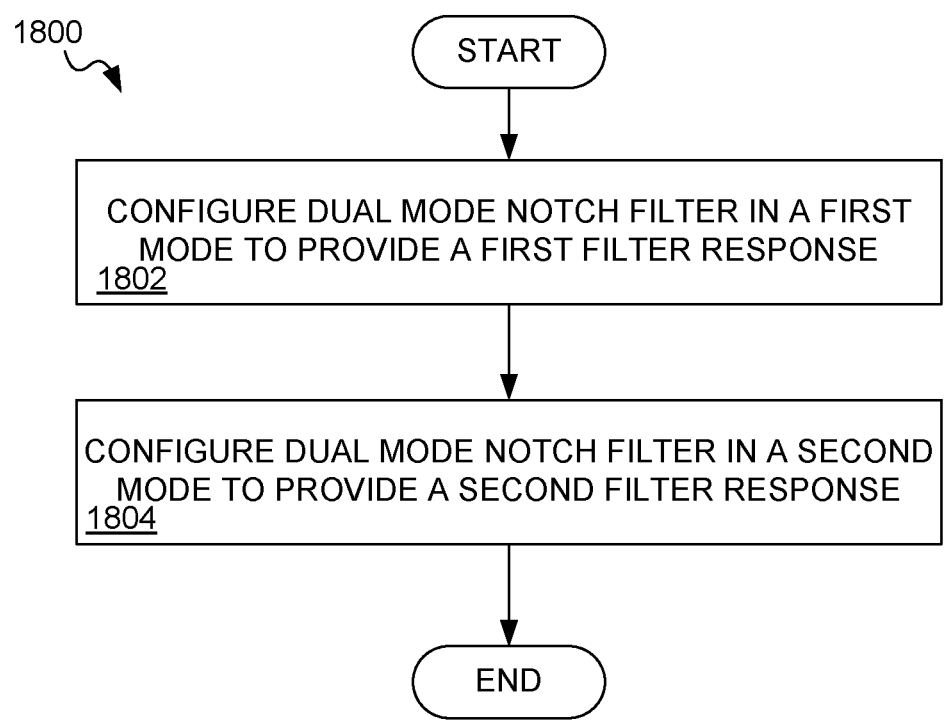
FIG. 18 is a flow chart describing an example of the operation of a dual mode notch filter in accordance with an exemplary embodiment of the disclosure.

FIG. 18 is a flow chart 1800 describing an example of the operation of a method for creating a notch filter response. The blocks in the method 1800 can be performed in or out of the order shown, and in some embodiments, can be performed at least in part in parallel.

In block 1802, the dual mode notch filter may be configured in a first mode to provide a first filter response. For example, the dual mode notch filter 550 may be configured in a first mode to provide a notch response at a first frequency (LO notch mode).

In block 1804, the dual mode notch filter may be configured in a second mode to provide a second filter response. For example, the dual mode notch filter 550 may be configured in a second mode to provide no filter response, and provide no effect on a signal at a frequency different than the first frequency (LO). Alternatively, the dual mode notch filter 550 may be configured in a second mode to provide a second filter response that includes a notch response at a second frequency (2LO notch mode).

Figure 19:
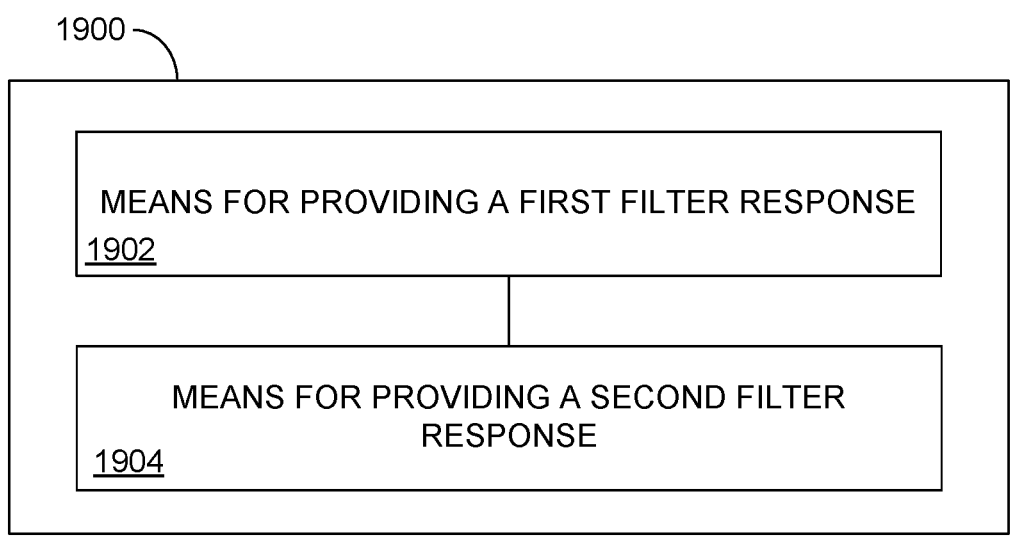
FIG. 19 is a functional block diagram of an apparatus for a dual mode notch filter in accordance with an exemplary embodiment of the disclosure.

FIG. 19 is a functional block diagram of an apparatus 1900 for a dual mode notch filter. The apparatus 1900 comprises means 1902 for providing a first filter response. In certain embodiments, the means 1902 for providing a first filter response can be configured to perform one or more of the functions described in operation block 1802 of method 1800 (FIG. 18). In an exemplary embodiment, the means 1902 for providing a first filter response may comprise the dual mode notch filter 550, for example configured in a first mode to provide a notch response at a first frequency (LO notch mode).

The apparatus 1900 also comprises means 1904 for providing a second filter response. In certain embodiments, the means 1904 for providing a second filter response can be configured to perform one or more of the functions described in operation block 1804 of method 1800 (FIG. 18). In an exemplary embodiment, the means 1904 for providing a second filter response may comprise the dual mode notch filter 550, for example configured in a second mode to provide no filter response, and provide no effect on a signal at a frequency different than the first frequency (LO). Alternatively, the dual mode notch filter 550 may be configured in a second mode to provide a second filter response that includes a notch response at a second frequency (2LO notch mode).

Implementation examples are described in the following numbered clauses:

1. A dual mode notch filter for use in a multi-band millimeter wave (mmW) transmitter, comprising a transmit filter circuit disposed between two amplifiers in a mmW transmit signal path, the transmit filter circuit formed by at least one switch, at least one capacitor, and a double-tuned transformer, the transmit filter circuit having at least two modes configured to selectively filter a spurious signal in at least a first communication band.

2. The dual mode notch filter of clause 1, wherein the transmit filter is configured to implement a notch response at a frequency of the spurious signal.

3. The dual mode notch filter of any of clauses 1 through 2, wherein the at least one switch is configured to selectively couple the at least one capacitor across a winding of the double-tuned transformer.

4. The dual mode notch filter of any of clauses 1 through 3, further comprising an additional capacitor coupled to the at least one switch, the additional capacitor selectively coupled across the winding of the double-tuned transformer, where the at least one switch is located between the at least one capacitor and the additional capacitor.

5. The dual mode notch filter of any of clauses 1 through 4, further comprising a circuit having a pair of transistors coupled across the winding of the double-tuned transformer, each transistor in the pair of transistors having a gate coupled to a drain of the other transistor in the pair of transistors and a source coupled together and coupled to a bias transistor.

6. The dual mode notch filter of clause 5, wherein the drain of each transistor of the pair of transistors is coupled to opposite sides of the winding of the double-tuned transformer.

7. The dual mode notch filter of clauses 5 or 6, wherein the bias transistor has a gate coupled to a control signal and has a source coupled to a system voltage and the bias transistor is configured to bias the pair of transistors with a bias voltage that ranges from zero volts to less than one (1) volt.

8. A transmit filter circuit comprising: a positive input terminal; a negative input terminal; a center-tapped inductance comprising a first terminal coupled to the positive input terminal and a second terminal coupled to the negative input terminal; a switch comprising a first terminal coupled to the first terminal of the center-tapped inductance and a second terminal coupled to the second terminal of the center-tapped inductance; a first capacitance coupled between the first terminal of the switch and the first terminal of the center-tapped inductance; and a second capacitance coupled between the second terminal of the switch and the second terminal of the center-tapped inductance.

9. The transmit filter circuit of clause 8, further comprising: a third capacitance coupled between the positive input terminal and the first terminal of the center-tapped inductance; and a fourth capacitance coupled between the negative input terminal and the second terminal of the center-tapped inductance.

10. The transmit filter circuit of any of clauses 8 through 9, further comprising: a first switch coupled between the positive input terminal and the first terminal of the center-tapped inductance; and a second switch coupled between the negative input terminal and the second terminal of the center-tapped inductance.

11. The transmit filter circuit of any of clauses 8 through 10, further comprising a circuit having a pair of transistors coupled across the center-tapped inductance, each transistor in the pair of transistors having a gate coupled to a drain of the other transistor in the pair of transistors and a source coupled together and coupled to a bias transistor.

12. The transmit filter circuit of clause 11, wherein the drain of each transistor of the pair of transistors is coupled to opposite sides of the center-tapped inductance.

13. The transmit filter circuit of clause 11 or 12, wherein the bias transistor has a gate coupled to a control signal and has a source coupled to a system voltage and the bias transistor is configured to bias the pair of transistors with a bias voltage that ranges from zero volts to less than one (1) volt.

14. The transmit filter circuit of any of clauses 8 through 13, wherein the transmit filter circuit is coupled to an output of an upconversion mixer, and wherein the transmit filter circuit is configured to provide in a first operating mode a first filter response configured to reduce unwanted spectral emission of a local oscillator (LO) signal to a first communication signal in a first communication band, while having a negligible effect on a second communication signal in a second communication band, and wherein the transmit filter circuit configured to provide in a second operating mode a second filter response.

15. The transmit filter circuit of any of clauses 8 through 14, wherein the transmit filter circuit is configured to reduce unwanted spectral emission of the LO signal at an LO frequency and at harmonics of the LO frequency while allowing the passage of a wide-bandwidth signal and creating a notch response at the LO frequency and at harmonics of the LO frequency.

16. The transmit filter circuit of any of clauses 8 through 15, wherein the transmit filter circuit is located between at least two RF amplifier stages.

17. The transmit filter circuit of any of clauses 14 through 16, wherein the transmit filter circuit is located in parallel with a double-tuned transformer in a mmW signal path including the upconversion mixer.

18. The transmit filter circuit of any of clauses 14 through 17, wherein: the first operating mode creates a notch filter response at the LO frequency while having a negligible effect on the second communication signal in the second communication band; and the second operating mode is an off mode configured to have a negligible effect on the first communication signal in the first communication band and on the second communication signal in the second communication band.

19. The transmit filter circuit of any of clauses 14 through 18, wherein: the first operating mode creates a notch filter response at the LO frequency; and the second operating mode creates a notch filter response at two times the LO frequency (2LO) and is configured to reduce unwanted spectral emission of a 2LO signal.

20. The transmit filter circuit of clause 18 or 19, further comprising a circuit configured to provide a negative resistance to compensate for resistive loss of the switch, wherein the switch is configured to select the notch filter response.

21. The transmit filter circuit of clause 20, wherein the circuit configured to provide a negative resistance to compensate for resistive loss of the switch is configured to be biased with a bias voltage that ranges from zero volts to less than one (1) volt.

22. A method for filtering a communication signal, comprising: providing a first filter response; and providing a second filter response, the first filter response configured to reduce unwanted spectral emission of a local oscillator (LO) signal to a first communication signal in a first communication band, while having a negligible effect on a second communication signal in a second communication band.

23. The method of clause 22, further comprising reducing unwanted spectral emission of the LO signal at an LO frequency and at harmonics of the LO frequency while allowing the passage of a wide-bandwidth signal and creating a notch response at the LO frequency and at harmonics of the LO frequency.

24. The method of any of clauses 22 through 23, further comprising: creating a notch filter response at an LO frequency while having a negligible effect on the second communication signal in the second communication band; and providing the second filter response configured to have a negligible effect on the first communication signal in the first communication band and on the second communication signal in the second communication band.

25. The method of any of clauses 22 through 24, further comprising: creating a first notch filter response at an LO frequency; and creating a second notch filter response at two times the LO frequency (2LO) configured to reduce unwanted spectral emission of a 2LO signal.

26. The method of clause 24 or 25, further comprising providing a negative resistance to compensate for loss of a switch that selects the notch filter response.

27. The method of clause 26, further comprising providing the negative resistance to compensate for loss of a switch that selects the notch filter response with a bias voltage that ranges from zero volts to less than one (1) volt.

28. A device, comprising: means for providing a first filter response; and means for proving a second filter response, the first filter response configured to reduce unwanted spectral emission of a local oscillator (LO) signal to a first communication signal in a first communication band, while having a negligible effect on a second communication signal in a second communication band.

29. The device of clause 28, further comprising means for compensating for loss of a switch that selects a filter response from the first filter response and the second filter response.

30. The device of any of clauses 28 through 29, further comprising means for providing a bias voltage that ranges from zero volts to less than one (1) volt to the means for compensating for loss of a switch that selects the notch filter response.

Certain descriptions herein refer to particular frequencies, values, device characteristics, etc. However, other frequencies, values, device characteristics are contemplated. For example, signal bandwidths, local oscillator (LO) frequencies, spurious signal frequencies, and other characteristics may differ from those described while remaining contemplated by the embodiments of the disclosure. Similarly, device technologies used to fabricate the switches and elements described here may differ while remaining contemplated by the embodiments of the disclosure.

The circuit architecture described herein described herein may be implemented on one or more ICs, analog ICs, RFICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) a module that may be embedded within other devices, (vi) a receiver, cellular phone, wireless device, handset, or mobile unit, (vii) etc.

Although selected aspects have been illustrated and described in detail, it will be understood that various substitutions and alterations may be made therein without departing from the spirit and scope of the present invention, as defined by the following claims.

What is claimed is:

1. A millimeter wave (mmW) transmitter, comprising:
a first amplifier configured to amplify a mmW transmit signal;
a second amplifier configured to amplify the mmW transmit signal;
a double-tuned transformer coupled to an output of the first amplifier and an input of the second amplifier; and
a transmit filter circuit coupled between the first amplifier and the second amplifier, the transmit filter circuit formed by at least one switch, at least one capacitor, and an inductance, the transmit filter circuit having at least two modes configured to selectively filter a spurious signal in at least a first mmW communication band.

2. The transmitter of claim 1, wherein the transmit filter is configured to implement a notch response at a frequency of the spurious signal.

3. The transmitter of claim 1, wherein the inductance comprises a winding of the double-tuned transformer and the at least one switch is configured to selectively couple the at least one capacitor across the winding of the double-tuned transformer.

4. The transmitter of claim 3, further comprising an additional capacitor coupled to the at least one switch, the additional capacitor selectively coupled across the winding of the double-tuned transformer, where the at least one switch is located between the at least one capacitor and the additional capacitor.

5. The transmitter of claim 3, further comprising a circuit having a pair of transistors coupled across the winding of the double-tuned transformer, each transistor in the pair of transistors having a gate coupled to a drain of the other transistor in the pair of transistors and a source coupled together and coupled to a bias transistor.

6. The transmitter of claim 5, wherein the drain of each transistor of the pair of transistors is coupled to opposite sides of the winding of the double-tuned transformer.

7. The transmitter of claim 5, wherein the bias transistor has a gate coupled to a control signal and has a source coupled to a system voltage and the bias transistor is configured to bias the pair of transistors with a bias voltage that ranges from zero volts to less than one (1) volt.

8. The transmitter of claim 1, wherein the inductance is coupled in parallel with a primary winding of the double-tuned transformer.

9. The transmitter of claim 1, further comprising:
a third amplifier configured to amplify the mmW transmit signal;
a second double-tuned transformer coupled to an output of the second amplifier and an input of the third amplifier; and
a second transmit filter circuit coupled between the second amplifier and the third amplifier, the second transmit filter circuit formed by at least one second switch, at least one second capacitor, and a second inductance.

10. A transmit filter circuit comprising:
a positive input terminal;
a negative input terminal;
a center-tapped inductance comprising a first terminal coupled to the positive input terminal and a second terminal coupled to the negative input terminal;

a switch comprising a first terminal coupled to the first terminal of the center-tapped inductance and a second terminal coupled to the second terminal of the center-tapped inductance;

a first capacitance coupled between the first terminal of the switch and the first terminal of the center-tapped inductance; and a second capacitance coupled between the second terminal of the switch and the second terminal of the center-tapped inductance.

11. The transmit filter circuit of claim 10, further comprising:
a third capacitance coupled between the positive input terminal and the first terminal of the center-tapped inductance; and
a fourth capacitance coupled between the negative input terminal and the second terminal of the center-tapped inductance.

12. The transmit filter circuit of claim 10, further comprising:
a first switch coupled between the positive input terminal and the first terminal of the center-tapped inductance; and
a second switch coupled between the negative input terminal and the second terminal of the center-tapped inductance.

13. The transmit filter circuit of claim 10, further comprising a circuit having a pair of transistors coupled across the center-tapped inductance, each transistor in the pair of transistors having a gate coupled to a drain of the other transistor in the pair of transistors and a source coupled together and coupled to a bias transistor.

14. The transmit filter circuit of claim 13, wherein the drain of each transistor of the pair of transistors is coupled to opposite sides of the center-tapped inductance.

15. The transmit filter circuit of claim 14, wherein the bias transistor has a gate coupled to a control signal and has a source coupled to a system voltage and the bias transistor is configured to bias the pair of transistors with a bias voltage that ranges from zero volts to less than one (1) volt.

16. The transmit filter circuit of claim 10, wherein the transmit filter circuit is coupled to an output of an upconversion mixer, and
wherein the transmit filter circuit is configured to provide in a first operating mode a first filter response configured to reduce unwanted spectral emission of a local oscillator (LO) signal to a first communication signal in a first communication band, while having a negligible effect on a second communication signal in a second communication band, and wherein the transmit filter circuit configured to provide in a second operating mode a second filter response.

17. The transmit filter circuit of claim 16, wherein the transmit filter circuit is configured to reduce unwanted spectral emission of the LO signal at an LO frequency and at harmonics of the LO frequency while allowing the passage of a wide-bandwidth signal and creating a notch response at the LO frequency and at harmonics of the LO frequency.

18. The transmit filter circuit of claim 16, wherein the transmit filter circuit is located between at least two RF amplifier stages.

19. The transmit filter circuit of claim 16, wherein the transmit filter circuit is located in parallel with a double-tuned transformer in a mmW signal path including the upconversion mixer.

20. The transmit filter circuit of claim 16, wherein:
the first operating mode creates a notch filter response at an LO frequency of the LO signal while having a negligible effect on the second communication signal in the second communication band; and
the second operating mode is an off mode configured to have a negligible effect on the first communication signal in the first communication band and on the second communication signal in the second communication band.

21. The transmit filter circuit of claim 20, further comprising a circuit configured to provide a negative resistance to compensate for resistive loss of the switch, wherein the switch is configured to select the notch filter response.

22. The transmit filter circuit of claim 21, wherein the circuit configured to provide a negative resistance to compensate for resistive loss of the switch is configured to be biased with a bias voltage that ranges from zero volts to less than one (1) volt.

23. The transmit filter circuit of claim 16, wherein:
the first operating mode creates a notch filter response at an LO frequency of the LO signal; and
the second operating mode creates a notch filter response at two times the LO frequency (2LO) and is configured to reduce unwanted spectral emission of a 2LO signal.

24. A method for filtering a communication signal, comprising:
amplifying a first communication signal in a first millimeter wave (mmW) communication band;
amplifying a second communication signal in a second mmW communication band;
providing a first filter response;
providing a second filter response, the first filter response configured to reduce unwanted spectral emission of a local oscillator (LO) signal to the first amplified communication signal, while having a negligible effect on the second amplified communication signal;
amplifying the first filtered communication signal; and
amplifying the second filtered communication signal.

25. The method of claim 24, further comprising reducing unwanted spectral emission of the LO signal at an LO frequency and at harmonics of the LO frequency while allowing the passage of a wide-bandwidth signal and creating a notch response at the LO frequency and at harmonics of the LO frequency.

26. The method of claim 24, further comprising:
creating a notch filter response at an LO frequency while having a negligible effect on the second communication signal in the second communication band; and
providing the second filter response configured to have a negligible effect on the first communication signal in the first communication band and on the second communication signal in the second communication band.

27. The method of claim 26, further comprising providing a negative resistance to compensate for loss of a switch that selects the notch filter response.

28. The method of claim 27, further comprising providing the negative resistance to compensate for loss of a switch that selects the notch filter response with a bias voltage that ranges from zero volts to less than one (1) volt.

29. The method of claim 24, further comprising:
creating a first notch filter response at an LO frequency; and
creating a second notch filter response at two times the LO frequency (2LO) configured to reduce unwanted spectral emission of a 2LO signal.

30. A device, comprising:
means for amplifying a first communication signal in a first millimeter wave (mmW) communication band;
means for amplifying a second communication signal in a second mmW communication band;
means for providing a first filter response;
means for providing a second filter response, the first filter response configured to reduce unwanted spectral emission of a local oscillator (LO) signal to the first amplified communication signal, while having a negligible effect on the second amplified communication signal;
means for amplifying the first filtered communication signal; and
means for amplifying the second filtered communication signal.

* * * * *